United States Patent [19]

Krasner

[11] Patent Number: 5,663,734

[45] Date of Patent: Sep. 2, 1997

[54] GPS RECEIVER AND METHOD FOR PROCESSING GPS SIGNALS

[75] Inventor: Norman F. Krasner, San Carlos, Calif.

[73] Assignee: Precision Tracking, Inc., San Jose, Calif.

[21] Appl. No.: 612,669

[22] Filed: Mar. 8, 1996

Related U.S. Application Data

[60] Provisional application No. 60/005,318, Oct. 9, 1995.

[51] Int. Cl.[6] .................................................. G01S 5/02
[52] U.S. Cl. .......................................... 342/357; 342/352
[58] Field of Search .................................. 342/357, 352, 342/356; 455/12.1

[56] References Cited

U.S. PATENT DOCUMENTS

| | | | |
|---|---|---|---|
| 4,445,118 | 4/1984 | Taylor et al. | 343/357 |
| 4,601,005 | 7/1986 | Kilvington | 364/602 |
| 4,701,934 | 10/1987 | Jasper | 375/1 |
| 4,785,463 | 11/1988 | Jane et al. | 375/1 |
| 4,797,677 | 1/1989 | MacDoran et al. | 342/352 |
| 4,959,656 | 9/1990 | Kumar | 342/418 |
| 4,998,111 | 3/1991 | Ma et al. | 342/352 |
| 5,043,736 | 8/1991 | Darnell et al. | 342/357 |
| 5,202,829 | 4/1993 | Geier | 364/449 |
| 5,223,844 | 6/1993 | Mansell et al. | 342/357 |
| 5,225,842 | 7/1993 | Brown et al. | 342/357 |
| 5,271,034 | 12/1993 | Abaunza | 375/1 |
| 5,311,194 | 5/1994 | Brown | 342/357 |
| 5,317,323 | 5/1994 | Kennedy et al. | 342/457 |
| 5,323,163 | 6/1994 | Maki | 342/357 |
| 5,365,450 | 11/1994 | Schuchman et al. | 364/449 |
| 5,379,047 | 1/1995 | Yokev et al. | 342/457 |
| 5,379,224 | 1/1995 | Brown et al. | 364/449 |
| 5,379,320 | 1/1995 | Fernandes et al. | 375/1 |
| 5,416,797 | 5/1995 | Gilhousen et al. | 375/705 |
| 5,420,592 | 5/1995 | Johnson | 342/357 |
| 5,430,759 | 7/1995 | Yokev et al. | 375/202 |
| 5,483,549 | 1/1996 | Weinberg et al. | 375/200 |

FOREIGN PATENT DOCUMENTS

2273218  6/1994  United Kingdom .
WO9428434  12/1994  WIPO .

OTHER PUBLICATIONS

–Davenport, Robert G. "FFT Processing of Direct Sequence Spreading Codes . . . " *IEEE 1991 National Aerospace and Electronics Conference NAECON 1991*, vol. 1, pp. 98–105, May (1991)–Pct International Search Report sent on Mar. 10, 1997.

(List continued on next page.)

*Primary Examiner*—Thomas H. Tarcza
*Assistant Examiner*—Dao L. Phan
*Attorney, Agent, or Firm*—Blakely, Sokoloff, Taylor & Zafman

[57] ABSTRACT

A GPS receiver in one embodiment includes an antenna which receives GPS signals at an RF frequency from in view satellites; a downconverter coupled to the antenna for reducing the RF frequency of the received GPS signals to an intermediate frequency (IF); a digitizer coupled to the downconverter and sampling the IF GPS signals at a predetermined rate to produce sampled IF GPS signals; a memory coupled to the digitizer storing the sampled IF GPS signals (a snapshot of GPS signals); and a digital signal processor (DSP) coupled to the memory and operating under stored instructions thereby performing Fast Fourier Transform (FFT) operations on the sampled IF GPS signals to provide pseudorange information. These operations typically also include preprocessing and post processing of the GPS signals. After a snapshot of data is taken, the receiver front end is powered down. The GPS receiver in one embodiment also includes other power management features and includes, in another embodiment the capability to correct for errors in its local oscillator which is used to sample the GPS signals. The calculation speed of pseudoranges, and sensitivity of operation, is enhanced by the transmission of the Doppler frequency shifts of in view satellites to the receiver from an external source, such as a basestation in one embodiment of the invention.

60 Claims, 11 Drawing Sheets

OTHER PUBLICATIONS

–PCT International Search Report sent on Feb. 21, 1997.

"RTCM Recommended Standards for Differential Navstar GPS Service, Version 2.0" Radio Technical Commission for Maritime Services, Jan. 1, 1990.

"Animal–borne GPS: Tracking the Habitat", Rogers & Anson, GPS World, pp. 21, 22, Jul., 1994.

"Navstar GPS User Equipment, Introduction", NATO, Feb. 1991.

"Navigation Journal of the Institute of Navigation, vol. 25, No. 2" The Institute of Navigation, 1978 (entire edition).

"GPS Receiver Structures", Petterson et al., ION–GPS–95, Session C4, Land Vehicular Applications, Palm Springs, CA Sep. 1995.

"An Application of the Global Positioning System to Search and Rescue and Remote Tracking", Raab, et al. Navigation Journal of Institute of Navigation, vol. 24, No. 3, 1977.

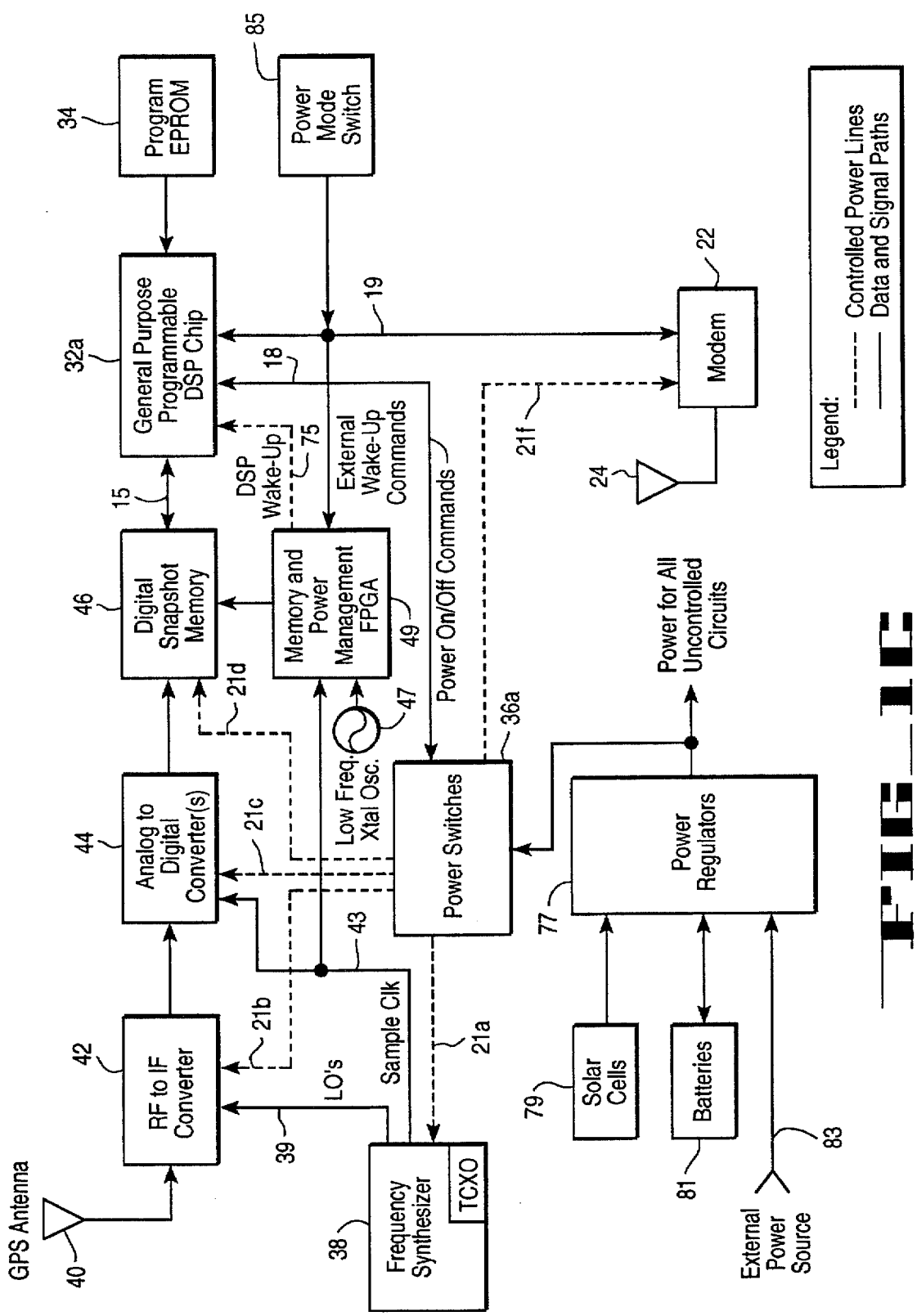
FIG_1C

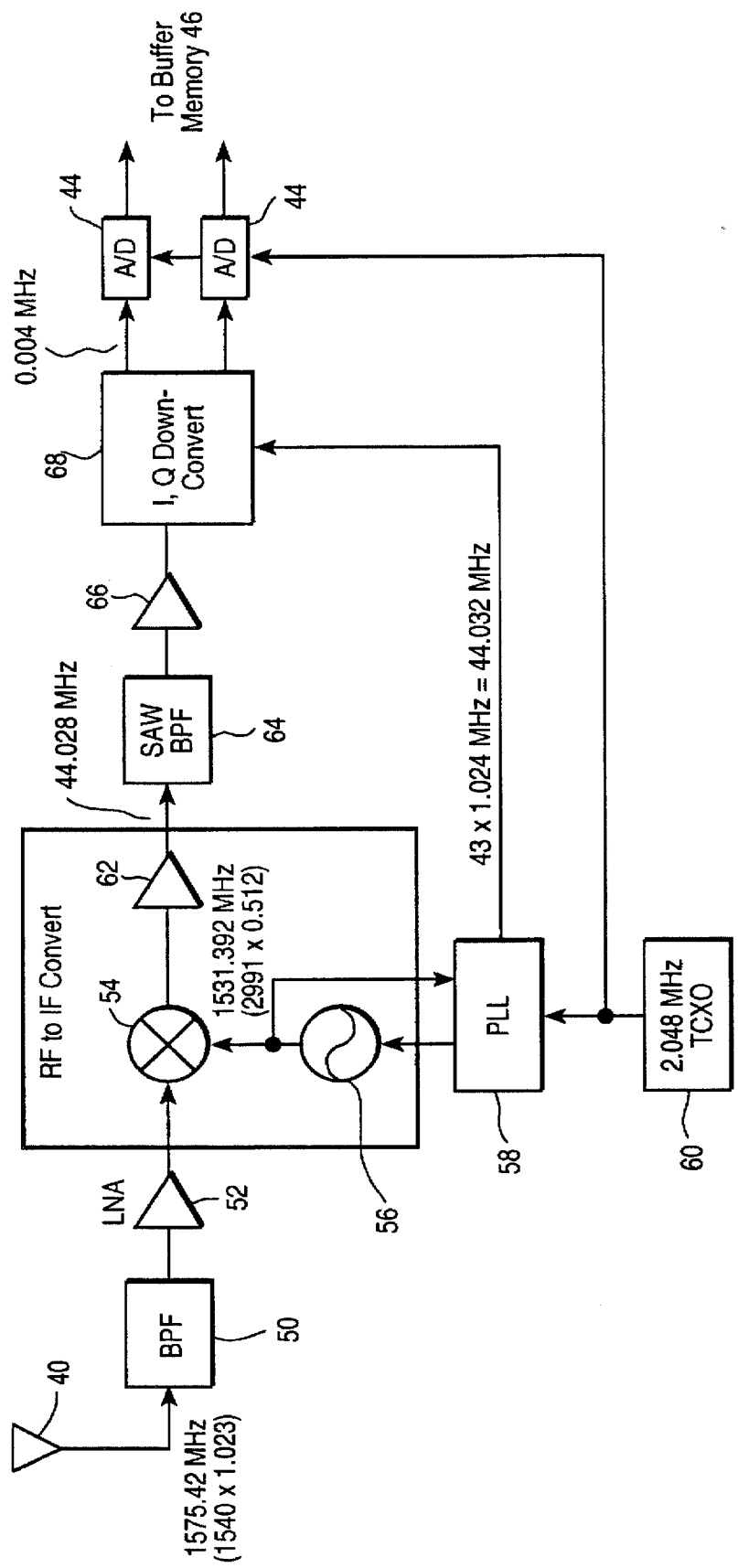
FIG._2A

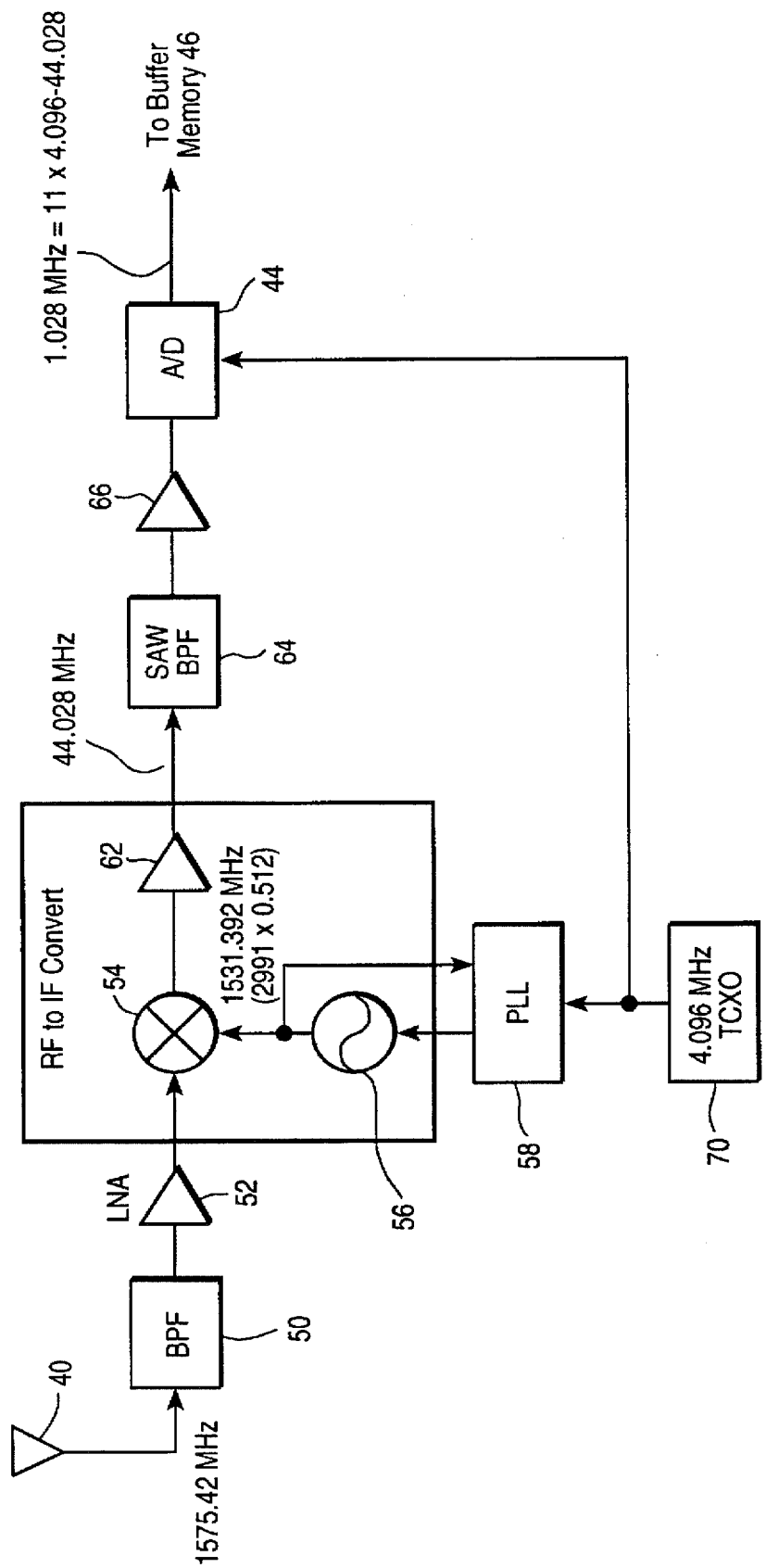
FIG_2B

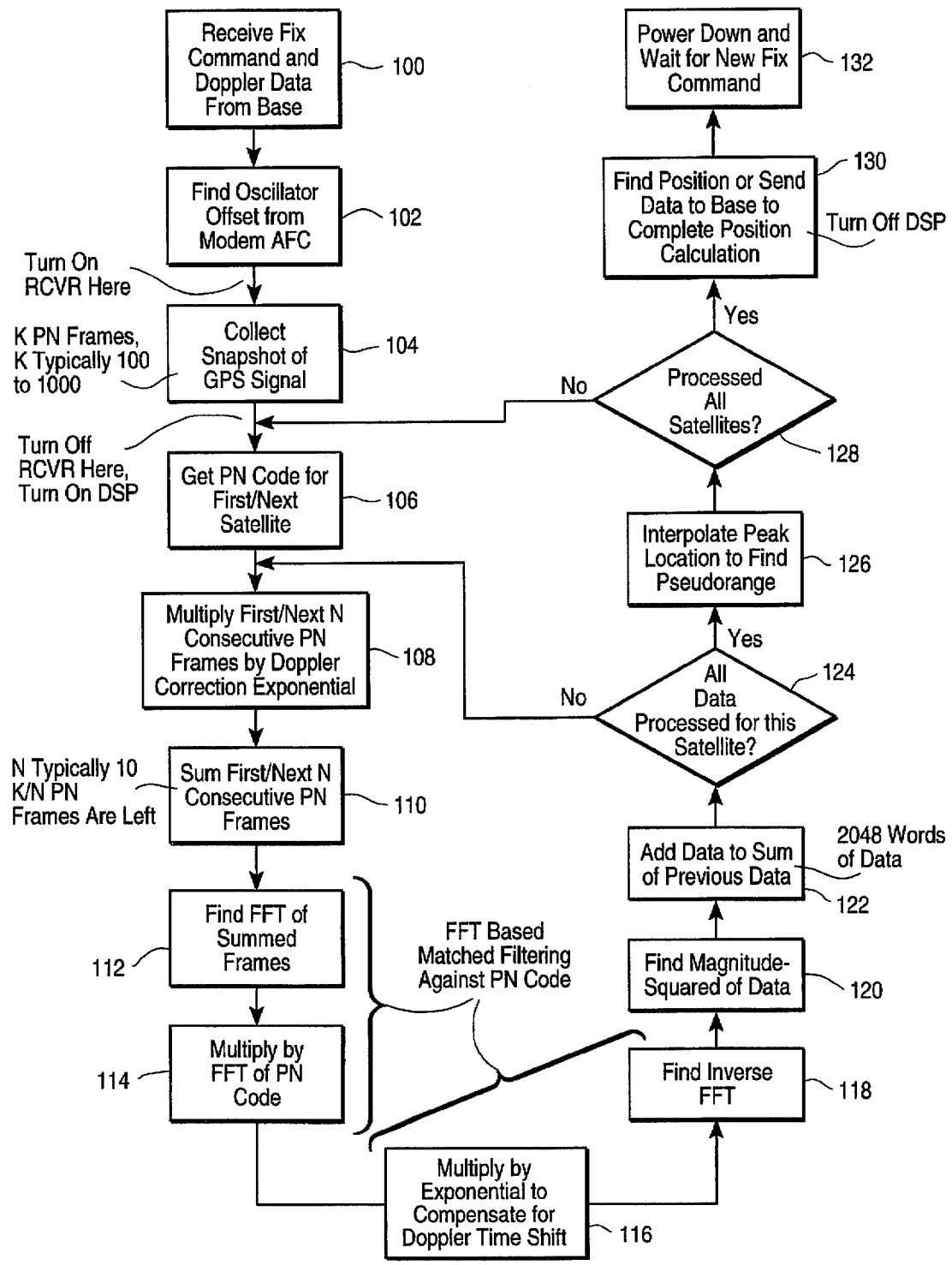

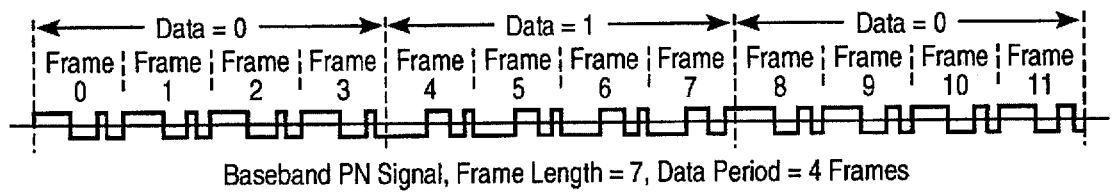
Baseband PN Signal, Frame Length = 7, Data Period = 4 Frames
FIG_4A
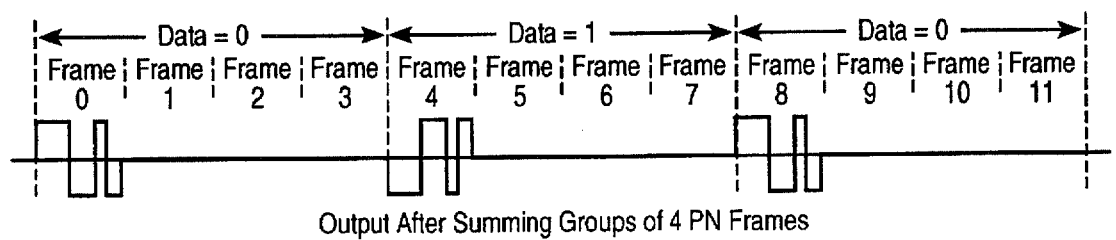
Output After Summing Groups of 4 PN Frames
FIG_4B
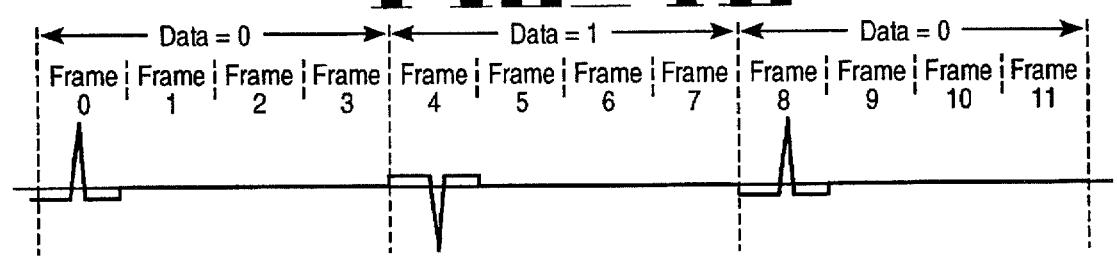
Output After FFT Based Matched Filter
FIG_4C
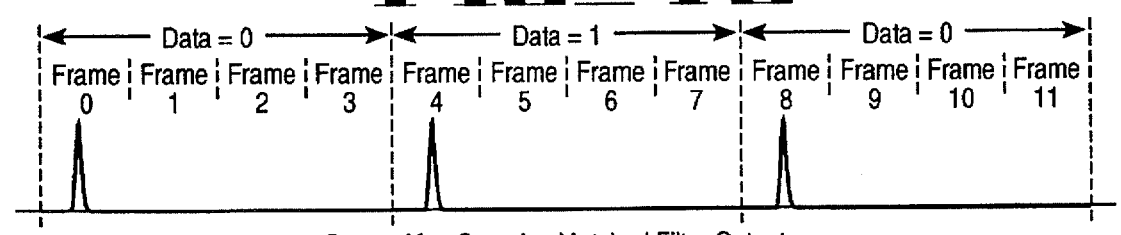
Output After Squaring Matched Filter Outputs
FIG_4D
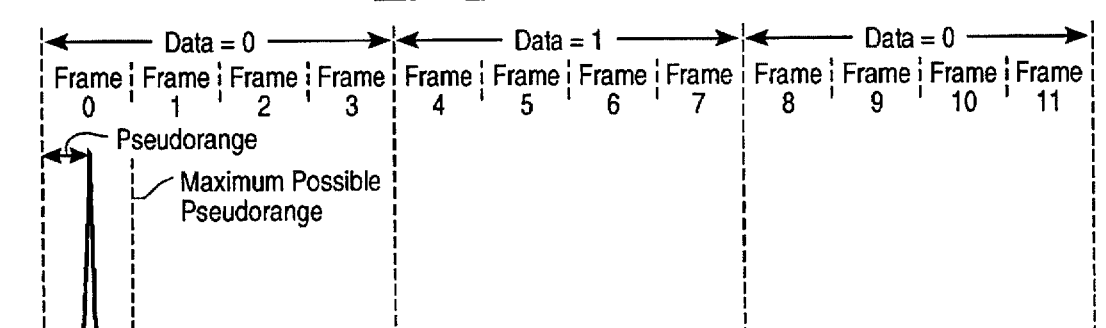
Output After Summing Outputs of D
FIG_4E

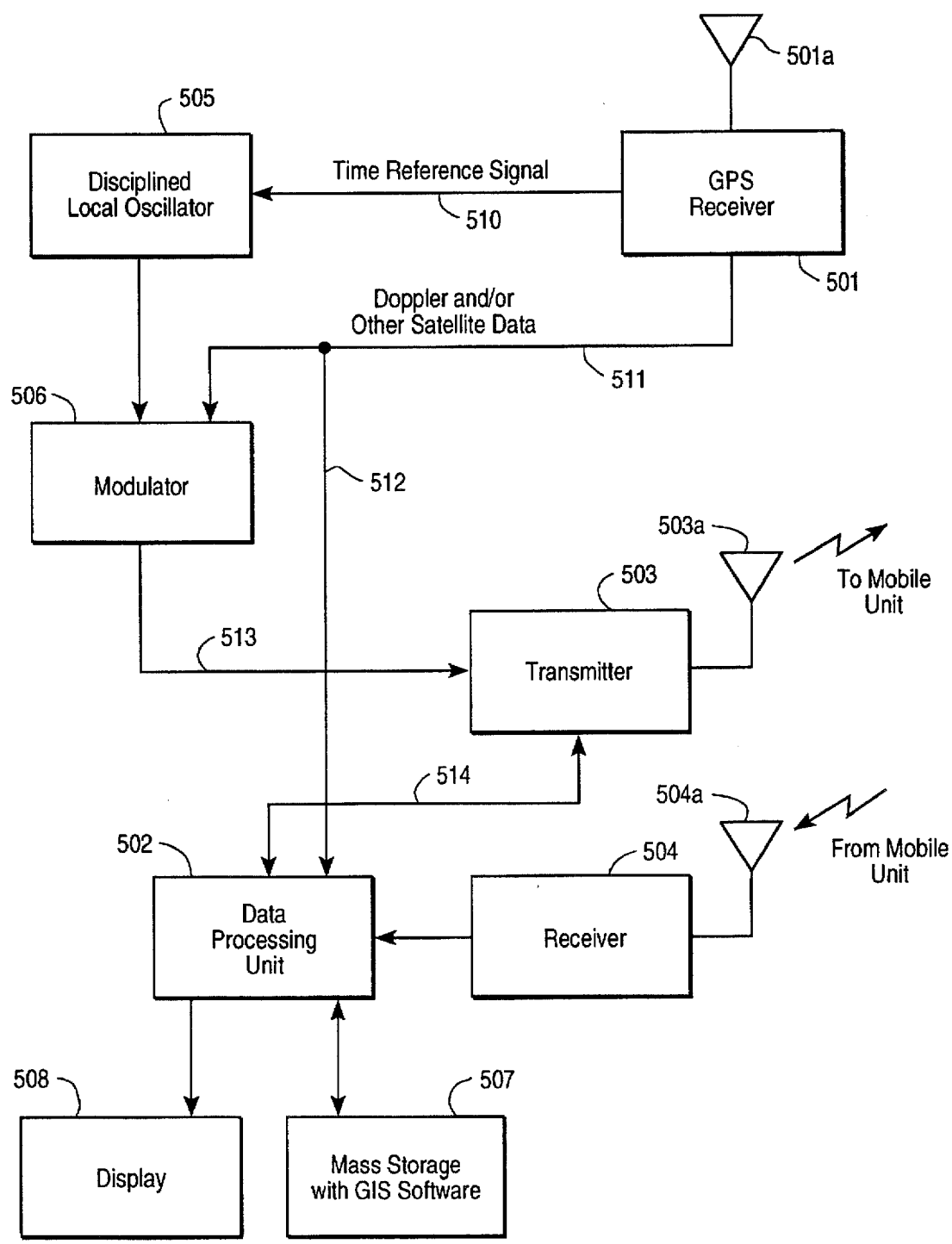
FIG_5A

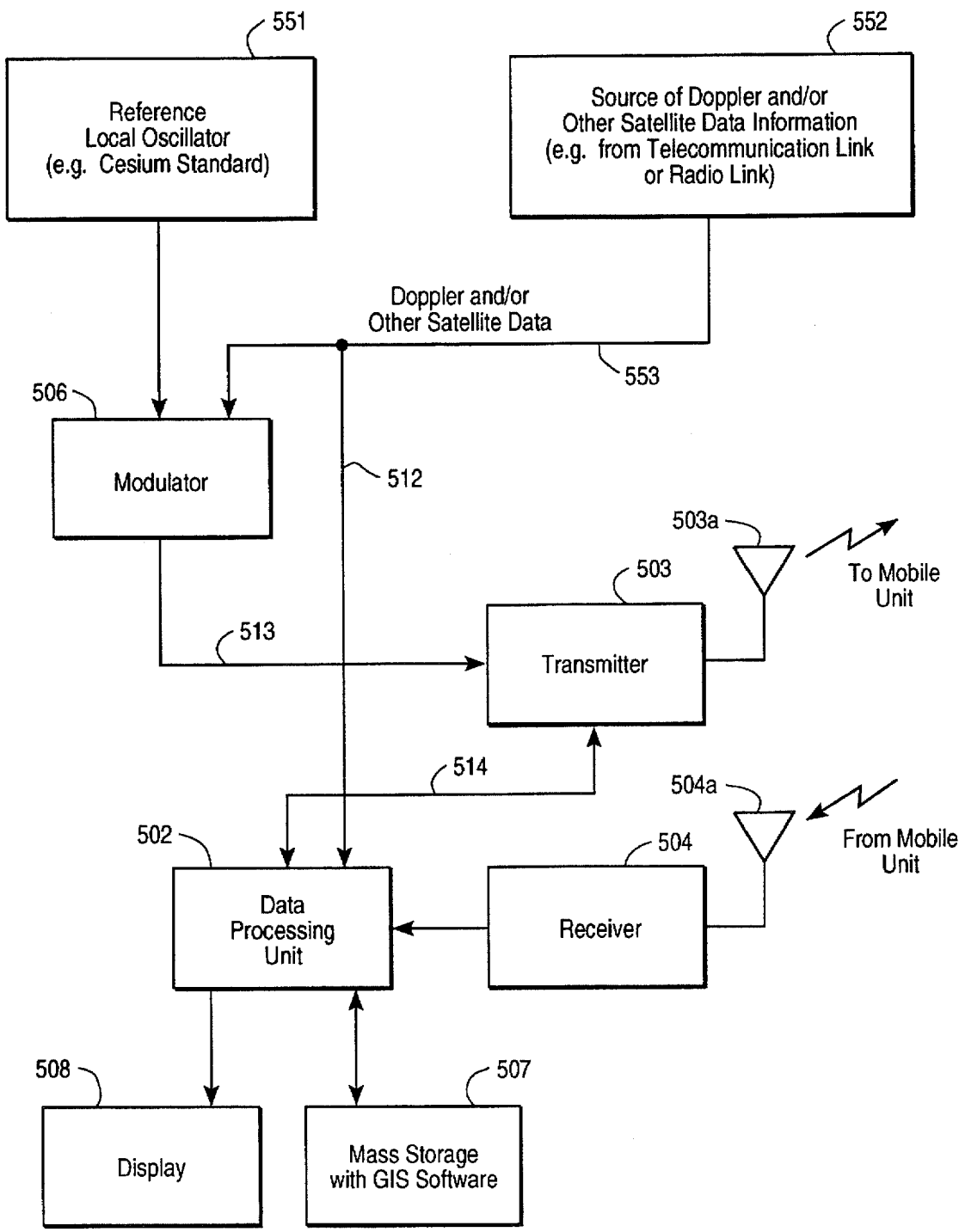
FIG_5B

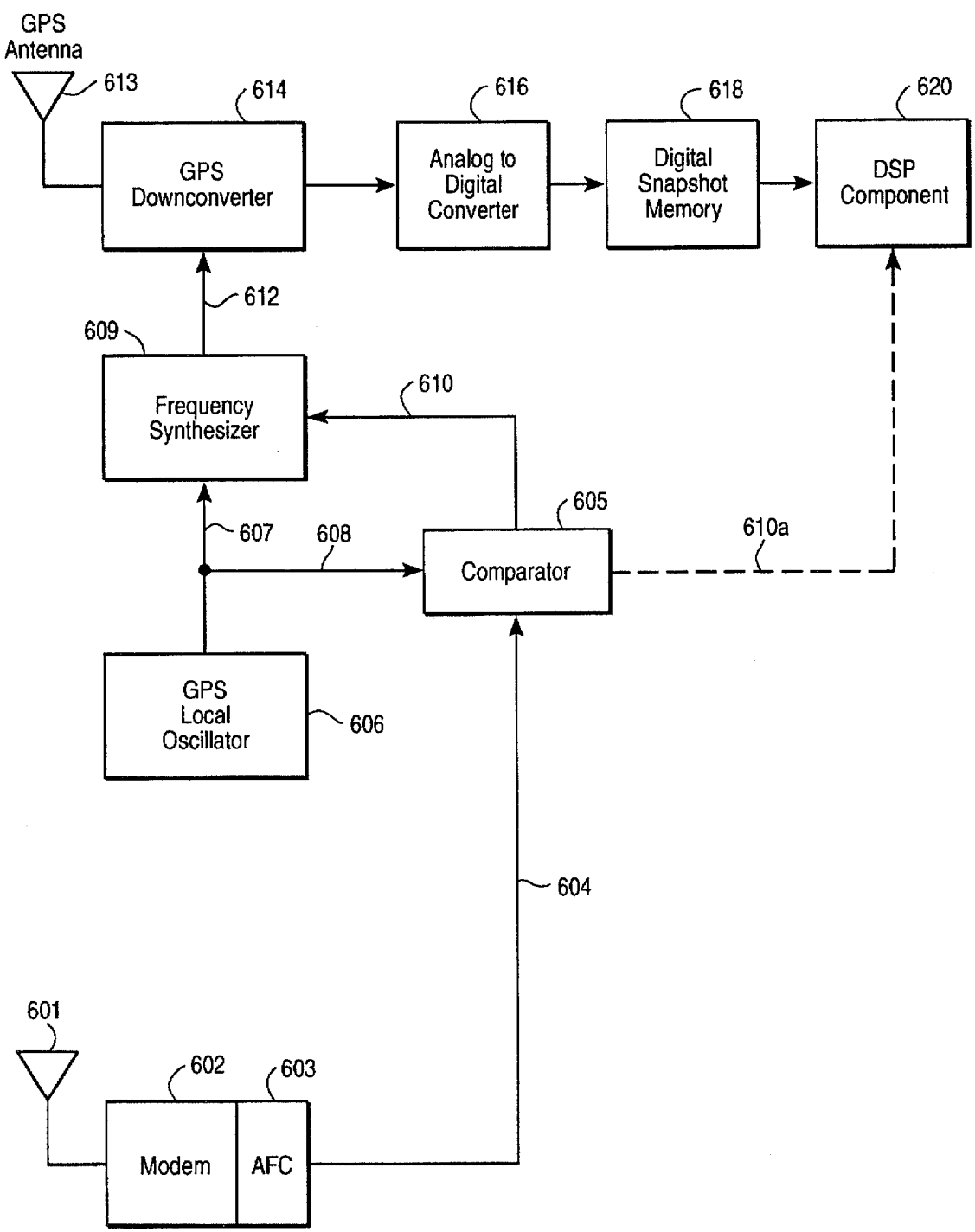
FIG_6

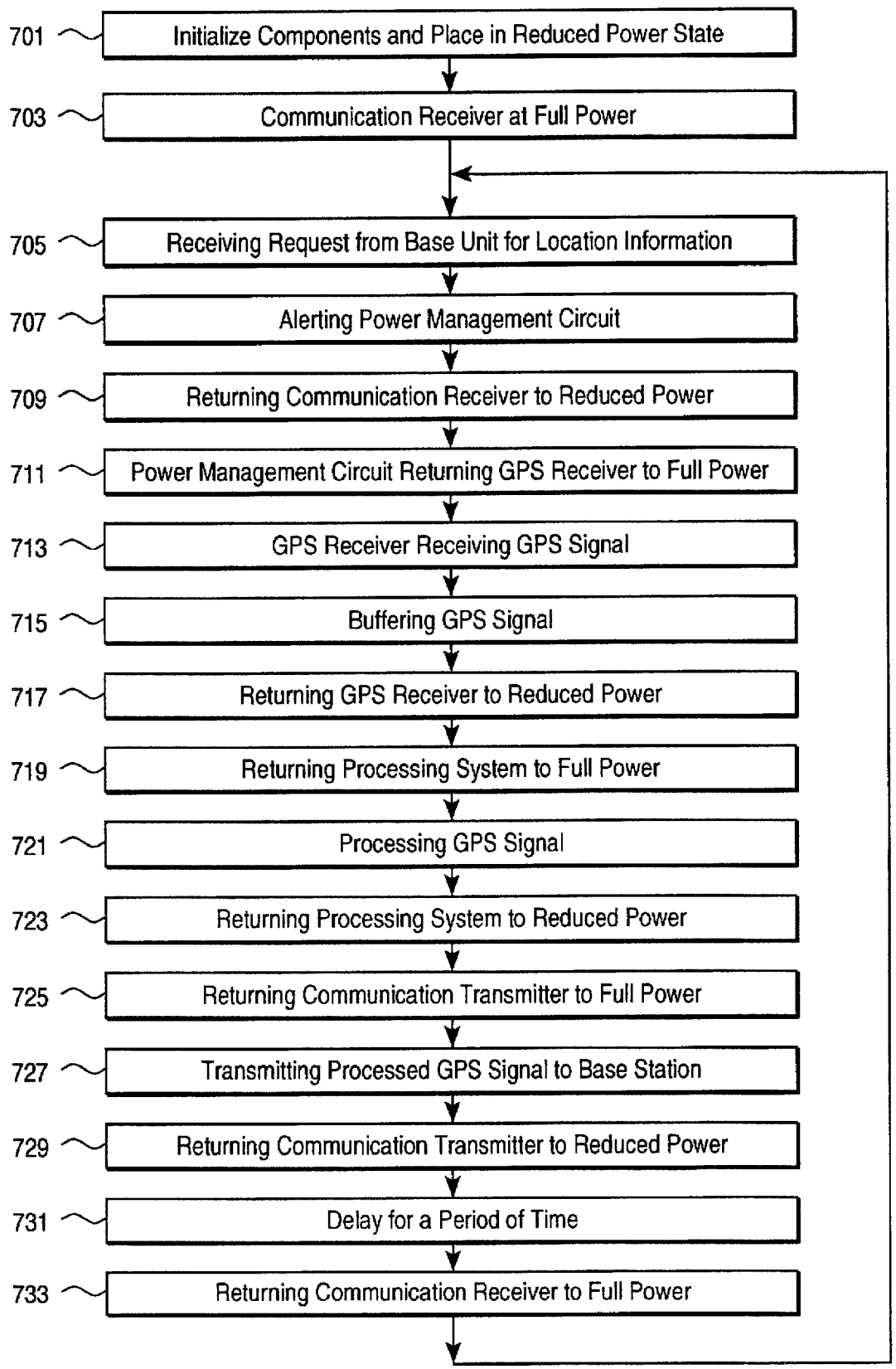
FIG_7

GPS RECEIVER AND METHOD FOR PROCESSING GPS SIGNALS

BACKGROUND OF THE INVENTION

RELATED APPLICATIONS

This application is related to two patent applications filed by the same inventor on the same date as this application; these two applications are: An Improved GPS Receiver Utilizing a Communication Link (Ser. No. 08/612,582); An Improved GPS Receiver Having Power Management (Ser. No. 08/613,966).

This application is also related to and hereby claims the benefit of the filing date of a provisional patent application by the same inventor, Norman F. Krasner, which application is entitled Low Power, Sensitive Pseudorange Measurement Apparatus and Method for Global Positioning Satellites Systems, Ser. No. 60/005,318, filed Oct. 9, 1995.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

1. FIELD OF THE INVENTION

The present invention relates to receivers capable of determining position information of satellites and, in particular, relates to such receivers which find application in global positioning satellite (GPS) systems.

2. BACKGROUND ART

GPS receivers normally determine their position by computing relative times of arrival of signals transmitted simultaneously from a multiplicity of GPS (or NAVSTAR) satellites. These satellites transmit, as part of their message, both satellite positioning data as well as data on clock timing, so-called "ephemeris" data. The process of searching for and acquiring GPS signals, reading the ephemeris data for a multiplicity of satellites and computing the location of the receiver from this data is time consuming, often requiring several minutes. In many cases, this lengthy processing time is unacceptable and, furthermore, greatly limits battery life in micro-miniaturized portable applications.

Another limitation of current GPS receivers is that their operation is limited to situations in which multiple satellites are clearly in view, without obstructions, and where a good quality antenna is properly positioned to receive such signals. As such, they normally are unusable in portable, body mounted applications; in areas where there is significant foliage or building blockage; and in in-building applications.

There are two principal functions of GPS receiving systems: (1) computation of the pseudoranges to the various GPS satellites, and (2) computation of the position of the receiving platform using these pseudoranges and satellite timing and ephemeris data. The pseudoranges are simply the time delays measured between the received signal from each satellite and a local clock. The satellite ephemeris and timing data is extracted from the GPS signal once it is acquired and tracked. As stated above, collecting this information normally takes a relatively long time (30 seconds to several minutes) and must be accomplished with a good received signal level in order to achieve low error rates.

Virtually all known GPS receivers utilize correlation methods to compute pseudoranges. These correlation methods are performed in real time, often with hardware correlators. GPS signals contain high rate repetitive signals called pseudorandom (PN) sequences. The codes available for civilian applications are called C/A codes, and have a binary phase-reversal rate, or "chipping" rate, of 1.023 MHz and a repetition period of 1023 chips for a code period of 1 msec. The code sequences belong to a family known as Gold codes. Each GPS satellite broadcasts a signal with a unique Gold code.

For a signal received from a given GPS satellite, following a downconversion process to baseband, a correlation receiver multiplies the received signal by a stored replica of the appropriate Gold code contained within its local memory, and then integrates, or lowpass filters, the product in order to obtain an indication of the presence of the signal. This process is termed a "correlation" operation. By sequentially adjusting the relative timing of this stored replica relative to the received signal, and observing the correlation output, the receiver can determine the time delay between the received signal and a local clock. The initial determination of the presence of such an output is termed "acquisition." Once acquisition occurs, the process enters the "tracking" phase in which the timing of the local reference is adjusted in small amounts in order to maintain a high correlation output. The correlation output during the tracking phase may be viewed as the GPS signal with the pseudorandom code removed, or, in common terminology, "despread." This signal is narrow band, with bandwidth commensurate with a 50 bit per second binary phase shift keyed data signal which is superimposed on the GPS waveform.

The correlation acquisition process is very time consuming, especially if received signals are weak. To improve acquisition time, most GPS receivers utilize a multiplicity of correlators (up to 12 typically) which allows a parallel search for correlation peaks.

Some prior GPS receivers have used FFT techniques to determine the Doppler frequency of the received GPS signal. These receivers utilize conventional correlation operations to despread the GPS signal and provide a narrow band signal with bandwidth typically in the range of 10 kHz to 30 kHz. The resulting narrow band signal is then Fourier analyzed using FFT algorithms to determine the carrier frequency. The determination of such a carrier simultaneously provides an indication that the local PN reference is adjusted to the correct phase of the received signal and provides an accurate measurement of carrier frequency. This frequency may then be utilized in the tracking operation of the receivers.

U.S. Pat. No. 5,420,592 to Johnson discusses the use of FFT algorithms to compute pseudoranges at a central processing location rather than at a mobile unit. According to that method, a snapshot of data is collected by a GPS receiver and then transmitted over a data link to a remote receiver where it undergoes FFT processing. However, the method disclosed therein computes only a single forward and inverse Fast Fourier Transform (corresponding to four PN periods) to perform the set of correlations.

As will be evident from the following description of the present invention, higher sensitivity and higher processing speed can be achieved by performing a large number of FFT operations together with special preprocessing and postprocessing operations.

In this patent the terms correlation, convolution and matched filtering are often utilized. The term "correlation" when applied to two series of numbers means the term by term multiplication of corresponding members of the two series followed by the summation of the series. This is sometimes referred to as "serial correlation" and results in an output that is a single number. In some circumstances, a succession of correlation operations are performed on successive groups of data.

The term "convolution" as applied to two series of numbers is the same as that commonly used in the art and is equivalent to a filtering of the second series of length m with a filter, corresponding to the first series, having an impulse response of length n. The result is a third series of length m+n−1. The term "matched filtering" refers to a convolution, or filtering, operation in which the aforementioned filter has an impulse response which is the time-reversed complex conjugate of the first series. The term "fast convolution" is utilized to indicate a series of algorithms that computes the convolution operation in an efficient manner.

Some authors utilize the terms correlation and convolution interchangeably; for clarity, however, in this patent, the term correlation always refers to the serial correlation operation described above.

SUMMARY

One embodiment of the present invention provides a method for determining the position of a remote GPS receiver by transmitting GPS satellite information, including Doppler, to the remote unit or mobile GPS unit from a basestation via a data communication link. The remote unit uses this information and received GPS signals from in view satellites to subsequently compute pseudoranges to the satellites. The computed pseudoranges are then transmitted to the basestation where the position of the remote unit is calculated. Various embodiments of apparatuses which can perform this method are also described.

Another embodiment of the present invention provides a GPS receiver having an antenna for receiving GPS signals from in view satellites; and a downconverter for reducing the RF frequency of the received GPS signals to an intermediate frequency (IF). The IF signals are digitized and stored in memory for later processing in the receiver. This processing typically is accomplished, in one embodiment of the invention, using a programmable digital signal processor which executes the instructions necessary to perform fast convolution (e.g. FFT) operations on the sampled IF GPS signals to provide pseudorange information. These operations also typically include preprocessing (prior to fast convolution) and post processing (after fast convolution) of stored versions of the GPS signals or processed and stored versions of the GPS signals.

Yet another embodiment of the present invention provides a method of power management for a GPS receiver and also provides a GPS receiver having power management features. Power dissipation is reduced over prior systems by receiving GPS signals from in view satellites; buffering these signals; and then turning off the GPS receiver. Other power management features are described.

BRIEF DESCRIPTION OF THE DRAWINGS

The present invention is illustrated by way of example and not limitation in the figures of the accompanying drawings in which references indicate similar element and in which:

FIG. 1C is a block diagram of another alternative GPS mobile unit.

FIGS. 2A and 2B provide two alternatives for the RF and IF portions of a receiver which is an embodiment of the present invention.

FIG. 3 shows a flow chart of the major operations (e.g. software operations) performed by the programmable DSP processor in accordance with the methods of the present invention.

FIG. 4 illustrates the signal processing waveforms at various stages of processing according to the methods of the present invention.

FIG. 5A illustrates a basestation system in one embodiment of the present invention.

FIG. 5B illustrates a basestation system in an alternative embodiment of the present invention.

FIG. 6 illustrates a GPS mobile unit having, according to one aspect of the present invention, local oscillator correction or calibration.

FIG. 7 is a flow chart which shows a power management method for a mobile unit according to one embodiment of the present invention.

DETAILED DESCRIPTION OF THE INVENTION

Figure 1A:
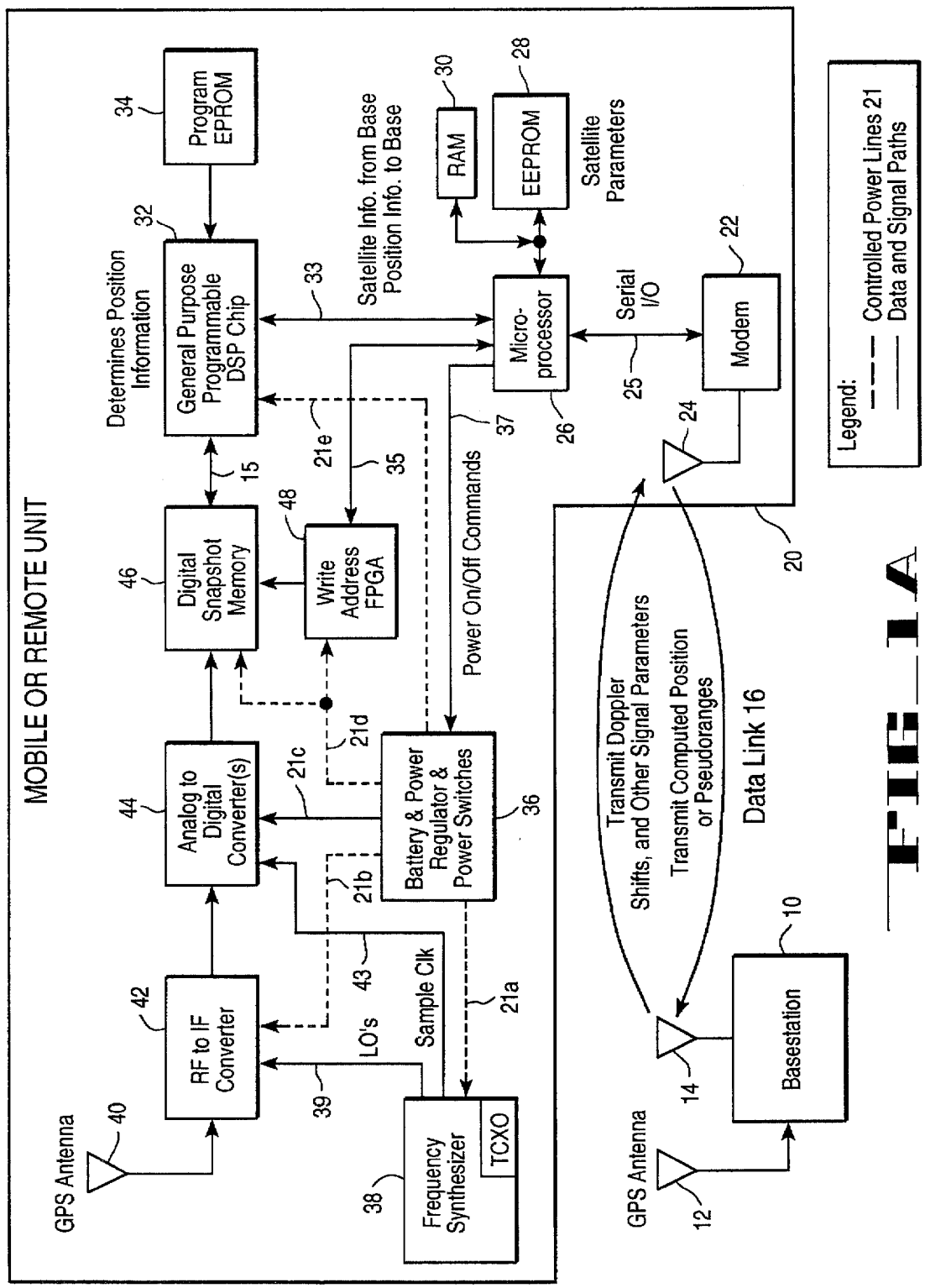
FIG. 1A is a block diagram of the major components of a remote or mobile GPS receiving system utilizing the methods of the present invention, and shows data links that may exist between a basestation and the remote.

This invention concerns apparatuses and methods for computing the position of a mobile, or remote, object in a manner that results in the remote hardware having very low power dissipation and the ability to operate with very low received signal levels. That is, power consumption is reduced while receiver sensitivity is increased. This is made possible by the implementation of the remote receiving functions, as shown in FIG. 1A, as well as the transmission of Doppler information from a separately located basestation 10 to the remote or GPS mobile unit 20.

It should be noted that pseudoranges may be used to compute the remote's geographical position in many different ways. Three examples are:

1. Method 1: By re-transmitting the satellite data messages to the remote 20 from the basestation 10, the remote 20 may combine this information with the pseudorange measurements to compute its position. See, for example, U.S. Pat. No. 5,365,450, which is incorporated herein by reference. Typically, the remote unit 20 performs the computation of position in the remote 20.

2. Method 2: The remote 20 may gather the satellite ephemeris data from the reception of GPS signals in the normal manner that is commonly practiced in the art. This data, which typically is valid for one to two hours, may be combined with pseudorange measurements to complete, typically in the remote unit, the position calculation.

3. Method 3: The remote 20 may transmit over a communications link 16 the pseudoranges to the basestation 10 which can combine this information with the satellite ephemeris data to complete the position calculation. See, for example, U.S. Pat. No. 5,225,842, which is incorporated herein by reference.

In approaches (or Methods) 1 and 3, it is assumed that the basestation 10 and remote 20 have a common view of all satellites of interest and are positioned close enough to one another to resolve a time ambiguity associated with the repetition rate of the GPS pseudorandom codes. This will be met for a range between basestation 10 and remote 20 of ½ times the speed of light times the PN repetition period (1 millisecond), or about 150 km.

In order to explain the current invention, it is assumed that method 3 is utilized to complete the position calculation. However, upon review of this Specification, it will be appreciated by those skilled in the art that the various aspects and embodiments of the present invention could be used with any of the above three Methods as well as other approaches. For example, in a variation of Method 1, satellite data information such as data representative of satellite ephemeris may be transmitted by a basestation to a remote unit, and this satellite data information may be combined with pseudo ranges, computed according to the present invention from buffered GPS signals, to provide a latitude and longitude (and in many cases also an altitude) for the remote unit. It will be appreciated that the position information received from the remote may be limited to the latitude and longitude or may be extensive information which includes latitude, longitude, altitude, velocity and bearing of the remote. Moreover, the local oscillator correction and/or the power management aspects of the present invention may be utilized in this variation of Method 1. Furthermore, Doppler information may be transmitted to the remote unit 20 and utilized by the remote unit 20 in accordance with aspects of the present invention.

Under Method 3, the basestation 10 commands the remote 20 to perform a measurement via a message transmitted over a data communications link 16 as shown in FIG. 1A. The basestation 10 also sends within this message Doppler information for the satellites in view, which is a form of satellite data information. This Doppler information typically is in the format of frequency information, and the message will typically also specify an identification of the particular satellites in view or other initialization data. This message is received by a separate modem 22 that is part of the remote unit 20, and it is stored in a memory 30 coupled to a low-power microprocessor 26. The microprocessor 26 handles data information transfer between the remote unit processing elements 32–48 and the modem 22, and it controls power management functions within the remote receiver 20, as will be evident in the subsequent discussion. Normally, the microprocessor 26 sets most or all remote unit 20's hardware to a low power, or power down, state, except when the pseudorange and/or other GPS calculations are being performed, or when an alternative source of power is available. However, the receiver portion of the modem is at least periodically turned on (to full power) to determine if the basestation 10 has sent a command to determine the remote's position.

This above-mentioned Doppler information is very short in duration since the required accuracy of such Doppler information is not high. For example, if 10 Hz accuracy were required and the maximum Doppler is approximately ±7 kHz, then an 11 bit word would suffice for each satellite in view. If 8 satellites were in view, then 88 bits would be required to specify all such Dopplers. The use of this information eliminates the requirement for the remote 20 to search for such Doppler, thereby reducing its processing time by in excess of a factor of 10. The use of the Doppler information also allows the GPS mobile unit 20 to process more quickly a sample of GPS signals and this tends to reduce the amount of time for which the processor 32 must receive full power in order to compute a position information. This alone reduces the power consumed by the remote unit 20 and contributes to improved sensitivity. Additional information may also be sent to the remote 20, including the epochs of the data in the GPS message.

The received data link signal may utilize a precision carrier frequency. The remote receiver 20 may employ, as shown in FIG. 6 which is described below, an automatic frequency control (AFC) loop to lock to this carrier and thereby further calibrate its own reference oscillator. A message transmission time of 10 msec, with a received signal to noise ratio of 20 dB, will normally allow frequency measurement via an AFC to an accuracy of 10 Hz or better. This will typically be more than adequate for the requirements of the present invention. This feature will also enhance the accuracy of the position calculations which are performed, either conventionally or using the fast convolution methods of the present invention.

In one embodiment of the invention, the communication link 16 is a commercially available narrow bandwidth radio frequency communication medium, such as a two-way pager system. This system may be used in embodiments where the amount of data transmitted between the remote 20 and basestation 10 is relatively small. The amount of data required for the transmission of Doppler and other data (e.g. initialization data such as the identities of the satellites in view) is relatively small and similarly the amount of data required for the position information (e.g. pseudoranges) is relatively small. Consequently, narrowband systems are adequate for this embodiment. This is unlike those systems which require the transmission of large amounts of data over a short period of time; these systems may require a higher bandwidth radio frequency communication medium.

Once the remote 20 receives a command (e.g., from the basestation 10) for GPS processing together with the Doppler information, the microprocessor 26 activates the RF to IF Converter 42, Analog to Digital Converter 44 and Digital Snapshot Memory 46 via a Battery and Power Regulator and Power Switches circuit 36 (and controlled power lines 21a, 21b, 21c and 21d) thereby providing full power to these components. This causes the signal from the GPS satellite which is received via antenna 40 to be downconverted to an IF frequency, where it subsequently undergoes digitization. A contiguous set of such data, typically corresponding to a duration of 100 milliseconds to 1 second (or even longer), is then stored in a Snapshot Memory 46. The amount of data stored may be controlled by the microprocessor 26 such that more data may be stored in the memory 46 (to obtain better sensitivity) in those situations when conserving power is not as important as obtaining better sensitivity, and less data may be stored in those situations when conservation of power is more important than sensitivity. Typically, sensitivity is more important when the GPS signals may be obstructed partially, and power conservation is less important when a copious power supply (e.g. a car battery) is available. The addressing of this memory 46 to store this data is controlled by a Field Programmable Gate Array integrated circuit 48. Downconversion of the GPS signal is accomplished using a frequency synthesizer 38 which provides local oscillator signal 39 to the converter 42 as discussed further below.

Note that all this time (while the snapshot memory 46 is being filled with the digitized GPS signals from the in view satellites) the DSP microprocessor 32 may be kept in a low power state. The RF to IF Converter 42 and Analog to Digital Converter 44 are typically only turned on for a short period of time, sufficient to collect and store the data required for pseudorange calculation. After the data collection is complete, these converter circuits are turned off or power is otherwise reduced via controlled power lines 21b and 21c (while the memory 46 continues to receive full power), thus not contributing to additional power dissipation during the actual pseudorange calculation. The pseudorange calculation is then performed using, in one embodiment, a general purpose, programmable digital signal processing IC 32 (DSP), as exemplified by a TMS320C30 integrated circuit from Texas Instruments. This DSP 32 is placed in an active power state by the microprocessor 26 and the circuit 36 via controlled power line 21e prior to performing such calculations.

This DSP 32 differs from others used in some remote GPS units in that it is general purpose and programmable, as compared to specialized custom digital signal processing IC's. Furthermore, the DSP 32 makes possible the use of a Fast Fourier Transform (FFT) algorithm, which permits very rapid computation of the pseudoranges by performing rapidly a large number of correlation operations between a locally generated reference and the received signals. Typically, 2046 such correlations are required to complete the search for the epochs of each received GPS signal. The Fast Fourier Transform algorithm permits a simultaneous and parallel search of all such positions, thus speeding the required computation process by a factor of 10 to 100 over conventional approaches.

Once the DSP 32 completes its computation of pseudoranges for each of the in view satellites, it transmits, in one embodiment of the invention, this information to the microprocessor 26 via interconnect bus 33. At this time the microprocessor 26 may cause the DSP 32 and memory 46 to again enter a low power state by sending an appropriate control signal to the Battery and Power Regulator circuit 36. Then, the microprocessor 26 utilizes a modem 22 to transmit the pseudorange data over a data link 16 to the basestation 10 for final position computation. In addition to the pseudorange data, a time tag may simultaneously be transmitted to the basestation 10 that indicates the elaspsed time from the initial data collection in the buffer 46 to the time of transmission of the data over the data link 16. This time tag improves the capability of the basestation to compute position calculation, since it allows the computation of the GPS satellite positions at the time of data collection. As an alternative, in accordance with Method 1 above, the DSP 32 may compute the position (e.g. latitude, longitude or latitude, longitude and altitude) of the remote unit and send this data to the microprocessor 26, which similarly relays this data to the basestation 10 via the modem 22. In this case the position computation is eased by the DSP maintaining the elapsed time from the reception of satellite data messages to the time at which the buffer data collection begins. This improves the capability of the remote unit to compute position calculation, since it allows the computation of the GPS satellite positions at the time of data collection.

As shown in FIG. 1A, modem 22, in one embodiment, utilizes a separate antenna 24 to transmit and receive messages over data link 16. It will be appreciated that the modem 22 includes a communication receiver and a communication transmitter which are alternatively coupled to the antenna 24. Similarly, basestation 10 may use a separate antenna 14 to transmit and receive data link messages, thus allowing continuous reception of GPS signals via GPS antenna 12 at the basestation 10.

It is expected, in a typical example, that the position calculations in the DSP 32 will require less than a few seconds of time, depending upon the amount of data stored in the digital snapshot memory 46 and the speed of the DSP or several DSPs.

It should be clear from the above discussion that the remote unit 20 need only activate its high power consumption circuits for a small fraction of time, if position calculation commands from the basestation 10 are infrequent. It is anticipated, in at least many situations, that such commands will result in the remote equipment being activated to its high power dissipation state only about 1% of the time or less.

This then allows battery operation for 100 times the length of time that would otherwise be possible. The program commands necessary for the performance of the power management operation are stored in EEPROM 28 or other suitable storage media. This power management strategy may be adaptable to different power availability situations. For example, when prime power is available the determination of position may occur on a continuing basis.

As indicated above, the digital snapshot memory 46 captures a record corresponding to a relatively long period of time. The efficient processing of this large block of data using fast convolution methods contributes to the ability of the present invention to process signals at low received levels (e.g., when reception is poor due to partial blockage from buildings, trees, etc.). All pseudoranges for visible GPS satellites are computed using this same buffered data. This provides improved performance relative to continuous tracking GPS receivers in situations (such as urban blockage conditions) in which the signal amplitude is rapidly changing.

Figure 1B:
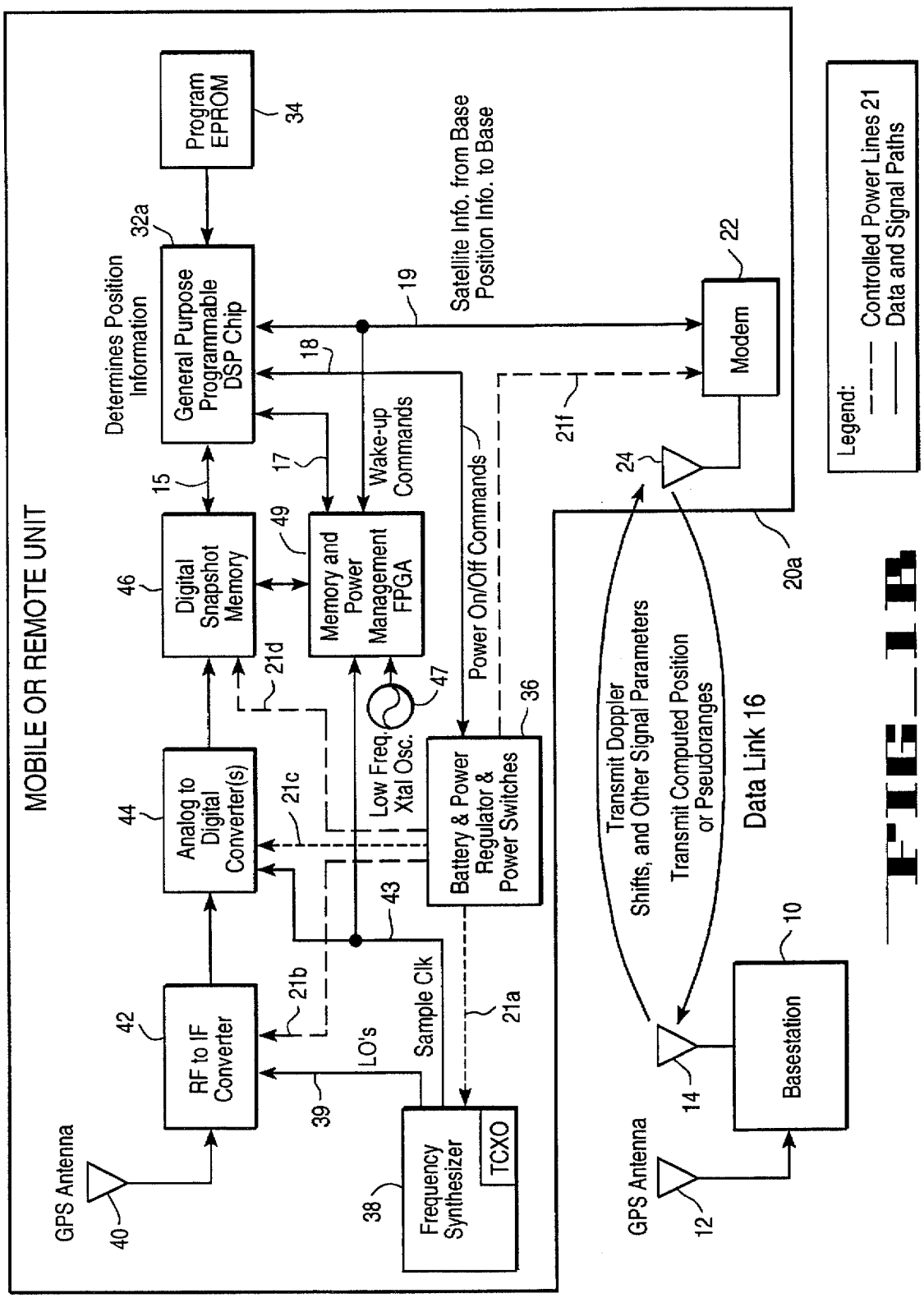
FIG. 1B is a block diagram of an alternative GPS mobile unit.

A slightly different implementation exhibited in FIG. 1B dispenses with the microprocessor 26 and its peripherals (RAM 30 and EEPROM 28) and replaces its functionality with additional circuitry contained within a more complex FPGA (field programmable gate array) 49. In this case the FPGA 49, a low power device, serves to wake-up the DSP 32a chip upon sensing activity from the modem 22 through interconnect 19. Interconnect 19 couples the modem to the DSP 32a and to the FPGA 19. The DSP chip 32a, when awake, directly transmits and receives data from the modem. The DSP 32a also performs power control operations through its interconnect 18 which is coupled to the Battery and Power Regulator and Switches 36 to provide power on/off commands to the circuit 36. The DSP 32a selectively powers on or reduces power to different components, according to a power management method such as that shown in FIG. 7, through the power on/off commands provided by interconnect 18 to the circuit 36. The circuit 56 receives these commands and selectively provides power (or reduces power) to the different components. The circuit 36 wakes up the DSP 32a via interconnect 17. The circuit 36 selectively provides power to the different components by selectively switching power through selected ones of controlled power lines 21a, 21b, 21c, 21d and 21f. Thus, for example, to provide power to the converter 42 and the converter 44, power is provided through lines 21b and 21c to these converters. Similarly, power to the modem is supplied through controlled power line 21f.

A low frequency crystal oscillator 47 is coupled to the memory and power management FPGA 49. In one embodiment, the memory and power management FPGA 49 contains a low power timer which includes the low frequency oscillator 47. When the FPGA 49 timer expires, the FPGA 49 sends a wake up signal to the DSP 32a through interconnect 17, and the DSP 32a can then wake up other circuitry by providing power on/off commands to the Battery and Power Regulator and Power Switches circuit 36. The other circuitry is powered, through the controlled power lines 21a, 21b, 21c, 21d and 21f under control of the circuit 36, in order to perform a positioning operation (e.g. determine a position information such as a pseudorange or a (latitude and longitude). Following the positioning operation, the DSP 32A resets the FPGA timer and reduces power to itself, and the circuit 36 also reduces power to the other components, in accordance with the method shown in FIG. 7. It will be appreciated that a battery or a plurality of batteries will provide power for all power controlled circuits through controlled power lines which are controlled by the memory and power management FPGA 49 and the DSP 32a. It will also be appreciated that, rather than directly reducing power by controlling power lines (such as 21b) to a component, the power consumed by a component may be reduced by signaling to the component (as in the case of DSP 32a via interconnect 17 in FIG. 1B) to reduce power or wake up to full power; this is often possible when a component, such as an integrated circuit, has an input for controlling the power state of the component, and the component has the necessary internal logic for controlling power consumption (e.g. logic for reducing power to various logical blocks of the component). The memory and power management FPGA 49 provides memory control and management, including addressing operations when data is being stored into the memory 46 from the converters 44 or when the DSP component 32a is reading data from the memory 46. The FPGA 49 may also be controlling other memory functions such as memory refresh if necessary.

FIG. 1C shows another embodiment according to the present invention of a GPS mobile unit which contains many of the same components as the GPS mobile units shown in FIGS. 1A and 1B. In addition, the GPS mobile unit shown in FIG. 1C includes power regulators 77 which are coupled to receive power from a plurality of batteries 81 as well as an optional external power source input 83 and solar cells 79. The power regulator 77 provides power for all circuits under control of the controlled power lines which are managed by the DSP chip 32a and the memory and power management FPGA 49 shown in FIG. 1C. The solar cell 79 may recharge, using conventional recharging technology, those batteries. The solar cells 79 may also provide power to the GPS mobile unit in addition to recharging the batteries. In the embodiment shown in FIG. 1C, the FPGA 49 provides a wake-up signal over interconnect 75 to the DSP chip 32a; this signal causes the DSP chip to return to full power to perform the various functions described for the DSP chip 32a. The DSP chip may also be activated to full power state via an external command from the modem 22 which is coupled directly to the DSP chip via interconnect 19.

FIG. 1C also shows a feature of the present invention which allows the GPS mobile unit to trade off sensitivity for power conservation. As described herein sensitivity of the GPS mobile unit may be increased by increasing the amount of buffered GPS signals which are stored in the memory 46. This is done by acquiring and digitizing more GPS signals and storing this data in the memory 46. While this increased buffering causes more power consumption, it does improve the sensitivity of the GPS mobile unit. This increased sensitivity mode may be selected by a power mode switch 85 on the GPS unit which is coupled to bus 19 to provide a command to the DPS chip 32a to enter an increased sensitivity mode. This power mode switch 85 may alternatively be caused to send a command to the DSP 32a chip to conserve more power and provide less sensitivity by acquiring a smaller snapshot of the GPS signals and thereby storing a smaller amount of GPS signals in the memory 46. It will be appreciated that this power mode selection may also occur through a signal sent from the basestation to the modem 22 which then communicates this command via interconnect 19 to the DSP chip 32a.

A representative example of an RF to IF frequency converter and digitizing system for the mobile GPS unit is shown in FIG. 2A. The input signal at 1575.42 MHz is passed through a bandlimiting filter (BPF) 50 and low noise amplifier (LNA) 52 and sent to a frequency conversion stage. The local oscillator (LO) 56 used in this stage is phase locked (via PLL 58) to a 2.048 MHz (or harmonic thereof) temperature compensated crystal oscillator (TCXO) 60. In a preferred implementation, the LO frequency would be 1531.392 MHz, which is 2991×0.512 MHz. The resulting IF signal is then centered at 44.028 MHz. This IF is desirable due to the availability of low cost components near 44 MHz. In particular, surface acoustic wave filters (SAW), which are utilized in abundance in television applications, are readily available. Of course, other bandlimiting devices could be used instead of SAW devices.

The received GPS signal is mixed with the LO signal in mixer 54 to produce the IF signal. This IF signal is passed through a SAW filter 64, for precision bandlimiting to 2 MHz bandwidth, and then sent to an I/Q down-converter 68, which translates the signal to near baseband (4 kHz center frequency nominally). The local oscillator frequency for this downconverter 68 is derived from the 2.048 MHz TCXO 60 as the 43rd harmonic of 1.024 MHz, that is 44.032 MHz.

The I/Q downconverter 68 is generally commercially available as an RF component. It typically consists of two mixers and lowpass filters. In such instances, the input ports of one mixer are fed with the IF signal and the LO signal and the input ports to the other mixer are fed with the same IF signal and the LO signal phase shifted by 90°. The outputs of the two mixers are lowpass filtered to remove feedthrough and other distortion products.

As shown in FIG. 2A, amplifiers 62 and 66 may be used before and after the bandlimiting operation as required.

The two outputs of the I/Q downconverter 68 are sent to two matched N/D converters 44 which sample the signals at 2.048 MHz. An alternative implementation replaces the A/D converters 44 with comparators (not shown), each of which outputs a two-valued (one-bit) sequence of data in accordance with the polarity of the incoming signal. It is well known that this approach results in a loss of approximately 1.96 dB in receiver sensitivity relative to a multilevel A/D converter. However, there may be substantial cost savings in use of a comparator vs. A/D converters, as well as in the reduced memory requirement in the following snapshot memory 46.

An alternative implementation of the downconverter and A/D system is shown in FIG. 2B which utilizes a bandpass sampling method. The TCXO 70 employed is at frequency 4.096 MHz (or an harmonic thereof). The TCXO output may be used as the sample clock to the A/D converter 44 (or comparator); this acts to translate the signal to 1.028 MHz. This frequency is the difference between the 11th harmonic of 4.096 MHz and the input IF frequency 44.028 MHz. The resulting 1.028 MHz IF is nearly one-fourth the sample rate, which is known to be nearly ideal in minimizing sampling type distortions. As compared to the I/Q sampling of FIG. 2A, this single sampler provides one channel of data rather than two, but at twice the rate. In addition, the data is effectively at an IF of 1.028 MHz. I/Q frequency conversion to near 0 MHz would then be implemented by digital means in the following processing to be described. The apparatus of FIG. 2A and 2B are competitive in cost and complexity; often component availability dictates the preferred approach. It will be apparent to those skilled in the art, however, that other receiver configurations could be used to achieve similar results.

In order to simplify the following discussion, the following assumes that the I/Q sampling of FIG. 2A is employed and that the snapshot memory 46 contains two channels of digitized data at 2.048 MHz.

Details of the signal processing performed in the DSP 32 may be understood with the aid of the flow chart of FIG. 3 and the pictorial of FIGS. 4A, 4B, 4C, 4D and 4E. It will be apparent to those skilled in the art that the machine code, or other suitable code, for performing the signal processing to be described is stored in EPROM 34. Other non-volatile storage devices could also be used. The objective of the processing is to determine the timing of the received waveform with respect to a locally generated waveform. Furthermore, in order to achieve high sensitivity, a very long portion of such a waveform, typically 100 milliseconds to 1 second, is processed.

In order to understand the processing, one first notes that each received GPS signal (C/A mode) is constructed from a high rate (1 MHz) repetitive pseudorandom (PN) pattern of 1023 symbols, commonly called "chips." These "chips" resemble the waveform shown in FIG. 4A. Further imposed on this pattern is low rate data, transmitted from the satellite at 50 baud. All of this data is received at a very low signal-to-noise ratio as measured in a 2 MHz bandwidth. If the carrier frequency and all data rates were known to great precision, and no data were present, then the signal-to-noise ratio could be greatly improved, and the data greatly reduced, by adding to one another successive frames. For example, there are 1000 PN frames over a period of 1 second. The first such frame could be coherently added to the next frame, the result added to the third frame, etc. The result would be a signal having a duration of 1023 chips. The phasing of this sequence could then be compared to a local reference sequence to determine the relative timing between the two, thus establishing the so-called pseudorange.

The above process must be carried out separately for each satellite in view from the same set of stored received data in the snapshot memory 46, since, in general, the GPS signals from different satellites have different Doppler frequencies and the PN patterns differ from one another.

The above process is made difficult by the fact that the carrier frequency may be unknown by in excess of 5 kHz due to signal Doppler uncertainty and by an additional amount due to receiver local oscillator uncertainty. These Doppler uncertainties are removed in one embodiment of the present invention by transmission of such information from a basestation 10 which simultaneously monitors all GPS signals from in view satellites. Thus, Doppler search is avoided at the remote 20. The local oscillator uncertainty is also greatly reduced (to perhaps 50 Hz) by the AFC operation performed using the base to remote communication signal, as illustrated in FIG. 6.

The presence of 50 baud data superimposed on the GPS signal still limits the coherent summation of PN frames beyond a period of 20 msec. That is, at most 20 frames may be coherently added before data sign inversions prevent further processing gain. Additional processing gain may be achieved through matched filtering and summation of the magnitudes (or squares of magnitudes) of the frames, as detailed in the following paragraphs.

The flow chart of FIG. 3 begins at step 100 with a command from the basestation 10 to initialize a GPS processing operation (termed a "Fix Command" in FIG. 3). This command includes sending, over a communication link 16, the Doppler shifts for each satellite in view and an identification of those satellites. At step 102, the remote unit 20 computes its local oscillator drift by frequency locking to the signal transmitted from the basestation 10. An alternative would be to utilize a very good quality temperature compensated crystal oscillator in the remote unit. For example, digitally controlled TCXOs, so-called DCXOs, currently can achieve accuracy of about 0.1 parts per million, or an error of about 150 Hz for the L1 GPS signal.

At step 104 the remote unit's microprocessor 26 turns on power to the receiver front end 42, Analog to Digital Converters 44 and digital snapshot memory 46, and collects a snapshot of data of duration K PN frames of the C/A code, where K is typically 100 to 1000 (corresponding to 100 msec to 1 second time duration). When a sufficient amount of data has been collected, microprocessor 26 turns off the RF to IF converter 42 and the A/D converters 44.

The pseudorange of each satellite is computed in turn as follows. First, at step 106 for the given GPS satellite signal to be processed, the corresponding pseudorandom code (PN) is retrieved from EPROM 34. As discussed shortly, the preferred PN storage format is actually the Fourier transform of this PN code, sampled at a rate of 2048 samples per the 1023 PN bits.

The data in snapshot memory 46 is processed in blocks of N consecutive PN frames, that is blocks of 2048N complex samples (N is an integer typically in the range 5 to 10 ). Similar operations are performed on each block as shown in the bottom loop (steps 108–124) of FIG. 3. That is, this loop is performed a total of K/N times for each GPS signal to be processed.

At step 108 the 2048N data words of the block are multiplied by a complex exponential that removes the effects of Doppler on the signal carrier, as well as the effects of drifting of the receiver local oscillator. To illustrate, suppose the Doppler frequency transmitted from the basestation 10 plus local oscillator offsets corresponded to $f_e$ Hz. Then the permultiplication of the data would take the form of the function $e^{-j2\pi f_e nT}$, n=[0, 1,2, . . . , 2048N−1]+(B−1)×2048N, where T=1/2.048 MHz is the sampling period, and the block number B ranges from 1 to K/N.

Next, at step 110, the adjacent groups of N (typically 10) frames of data within the block are coherently added to one another. That is, samples 0,2048, 4096, . . . 2048(N−1)−1 are added together, then 1,2049,4097, . . . 2048(N−1) are added together, etc. At this point the block contains only 2048 complex samples. An example of the waveform produced by such a summing operation is illustrated in FIG. 4B for the case of 4 PN frames. This summing operation may be considered a preprocessing operation which precedes the fast convolution operations.

Next, at steps 112–118, each of the averaged frames undergoes a matched filtering operation, whose purpose is to determine the relative timing between the received PN code contained within the block of data and a locally generated PN reference signal. Simultaneously, the effects of Doppler on the sampling times is also compensated for. These operations are greatly speeded, in one embodiment, by the use of fast convolution operations such as Fast Fourier Transform algorithms used in a manner to perform circular convolution, as presently described.

In order to simplify discussion, the above mentioned Doppler compensation is initially neglected.

The basic operation to be performed is a comparison of the data in the block being processed (2048 complex samples) to a similar reference PN block stored locally. The comparison is actually done by (complex) multiplying each element of the data block by the corresponding element of the reference and summing the results. This comparison is termed a "correlation." However, an individual correlation is only done for one particular starting time of the data block, whereas there are 2048 possible positions that might provide a better match. The set of all correlation operations for all possible starting positions is termed a "matched filtering" operation. The full matched filtering operation is required in a preferred embodiment.

The other times of the PN block can be tested by circularly shifting the PN reference and reperforming the same operation. That is, if the PN code is denoted p(0) p(1) . . . p(2047), then a circular shift by one sample is p(1) p(2) . . . p(2047) p(0). This modified sequence tests to determine if the data block contains a PN signal beginning with sample p(1). Similarly the data block may begin with samples p(2), p(3), etc., and each may be tested by circularly shifting the reference PN and reperforming the tests. It should be apparent that a complete set of tests would require 2048×2048= 4,194,304 operations, each requiring a complex multiplication and addition.

A more efficient, mathematically equivalent method may be employed, utilizing the Fast Fourier Transform (FFT), which only requires approximately 12 ×2048 complex multiplications and twice the number of additions. In this method, the FFT is taken for the data block, at step 112, and for the PN block. The FFT of the data block is multiplied by the complex conjugate of the FFT of the reference, at step 114, and the results are inverse Fourier transformed at step 118. The resulting data so gotten is of length 2048 and contains the set of correlations of the data block and the PN block for all possible positions. Each forward or inverse FFT operation requires P/2 $\log_2 P$ operations, where P is the size of the data being transformed (assuming a radix-2 FFT algorithm is employed). For the case of interest, B=2048, so that each FFT requires 11×1024 complex multiplications. However, if the FFT of the PN sequence is prestored in EPROM 34, as in a preferred embodiment, then its FFT need not be computed during the filtering process. The total number of complex multiplies for the forward FFT, inverse FFT and the product of the FFTs is thus (2×11+2) ×1024= 24576, which is a savings of a factor of 171 over direct correlation. FIG. 4C illustrates the waveform produced by this matched filtering operation.

The preferred method of the current invention utilizes a sample rate such that 2048 samples of data were taken over the PN period of 1023 chips. This allows the use of FFT algorithms of length 2048. It is known that FFT algorithms that are a power of 2, or 4, are normally much more efficient than those of other sizes (and 2048=$2^{11}$). Hence the sampling rate so chosen significantly improves the processing speed. It is preferable that the number of samples of the FFT equal the number of samples for one PN frame so that proper circular convolution may be achieved. That is, this condition allows the test of the data block against all circularly shifted versions of the PN code, as discussed above. A set of alternative methods, known in the art as "overlap save" or "overlap add" convolution may be utilized if the FFT size is chosen to span a number of samples different from that of one PN frame length. These approaches require approximately twice the number of computations as described above for the preferred implementation.

It should be apparent to one skilled in the art how the above process may be modified by utilizing a variety of FFT algorithms of varying sizes together with a variety of sample rates to provide fast convolution operations. In addition, a set of fast convolution algorithms exist which also have the property that the number of computations required are proportional to B $\log_2 B$ rather than $B^2$ as is required in straightforward correlation. Many of these algorithms are enumerated in standard references, for example, H. J. Nussbaumer, "Fast Fourier Transform and Convolution Algorithms," New York, Springer-Verlag, C1982. Important examples of such algorithms are the Agarwal-Cooley Algorithm, the split nesting algorithm, recursive polynomial nesting algorithm, and the Winograd-Fourier algorithm, the first three of which are used to perform convolution and the latter used to perform a Fourier transform. These algorithms may be employed in substitution of the preferred method presented above.

The method of time Doppler compensation employed at step 116 is now explained. In the preferred implementation, the sample rate utilized may not correspond exactly to 2048 samples per PN frame due to Doppler effects on the received GPS signal as well as local oscillator instabilities. For example, it is known that the Doppler shift can contribute a delay error of ±2700 nsec/sec. In order to compensate for this effect, the blocks of data processed in the above description need to be time shifted to compensate for this error. As an example, if the block size processed corresponds to 5 PN frames (5 msec), then the time shift from one block to another could be as much as ±13.5 nsec. Smaller time shifts result from local oscillator instability. These shifts may be compensated for by time shifting the successive blocks of data by multiples of the time shift required by a single block. That is, if the Doppler time shift per block is d, then the blocks are time shifted by nd, n=0, 1, 2, . . . .

In general these time shifts are fractions of a sample. Performing these operations directly using digital signal processing methods involves the use of nonintegral signal interpolation methods and results in a high computation burden. An alternative approach, that is a preferred method of the present invention, is to incorporate the processing within the fast Fourier transform functions. It is well-known that a time shift of d seconds is equivalent to multiplying the Fourier Transform of a function by $e^{-j2\pi fd}$, where f is the frequency variable. Thus, the time shift may be accomplished by multiplying the FFT of the data block by $e^{-j2\pi nd/T_f}$ for n=0, 1, 2, . . . , 1023 and by $e^{-j2\pi(n-2048)d/T_f}$ for n=1024, 1025, . . . , 2047, where $T_f$ is the PN frame duration (1 millisecond). This compensation adds only about 8% to the processing time associated with the FFT processing. The compensation is broken into two halves in order to guarantee continuity of phase compensation across 0 Hz.

After the matched filtering operation is complete, the magnitudes, or magnitudes-squared, of the complex numbers of the block are computed at step 120. Either choice will work nearly as well. This operation removes effects of 50 Hz data phase reversals (as shown in FIG. 4D) and low frequency carrier errors that remain. The block of 2048 samples is then added to the sum of the previous blocks processed at step 122. Step 122 may be considered a post processing operation which follows the fast convolution operation provided by steps 112–118. This continues until all K/N blocks are processed, as shown by the decision block at step 124, at which time there remains one block of 2048 samples, from which a pseudorange is calculated. FIG. 4E illustrates the resulting waveform after the summing operation.

Pseudorange determination occurs at step 126. A peak is searched for above a locally computed noise level. If such a peak is found, its time of occurrence relative to the beginning of the block represents the pseudorange associated with the particular PN code and the associated GPS satellite.

An interpolation routine is utilized at step 126 to find the location of the peak to an accuracy much greater than that associated with the sample rate (2.048 MHz). The interpolation routine depends upon the prior bandpass filtering used in the RF/IF portion of the remote receiver 20. A good quality filter will result in a peak having a nearly triangular shape with the width of the base equal to 4 samples. Under this condition, following subtraction of an average amplitude (to remove a DC baseline), the largest two amplitudes may be used to determine the peak position more precisely. Suppose these amplitudes are denoted $A_p$ and $A_{p+1}$, where $A_p \geq A_{p+1}$, without loss of generality, and p is the index of the peak amplitude. Then the position of the peak relative to that corresponding to $A_p$ may be provided by the formula: peak location=$p+A_p/(A_p+A_{p+1})$. For example if $A_p=A_{p+1}$, then the peak location is found to be p+0.5, that is, halfway between the indices of the two samples. In some situations the bandpass filtering may round the peak and a three point polynomial interpolation may be more suitable.

In the preceding processing, a local noise reference used in thresholding, may be computed by averaging all the data in the final averaged block, after removing the several largest such peaks.

Once the pseudorange is found, the processing continues at step 128 in a similar manner for the next satellite in view, unless all such satellites have been processed. Upon completion of the processing for all such satellites, the process continues at step 130 where the pseudorange data is transmitted to the basestation 10 over a communication link 16, where the final position calculation of the remote is performed (assuming Method 3 is utilized). Finally, at step 132, the majority of the circuitry of the remote 20 is placed in a low power state, awaiting a new command to perform another positioning operation.

A summary of the signal processing described above and shown in FIG. 3 will now be provided. The GPS signals from one or more in view GPS satellites are received at the remote GPS unit using an antenna on the remote GPS unit. These signals are digitized and stored in a buffer in the remote GPS unit. After storing these signals, a processor performs preprocessing, fast convolution processing, and post processing operations. These processing operations involve:

a) breaking the stored data into a series of contiguous blocks whose durations are equal to a multiple of the frame period of the pseudorandom (PN) codes contained within the GPS signals.

b) for each block performing a preprocessing step which creates a compressed block of data with length equal to the duration of a pseudorandom code period by coherently adding together successive subblocks of data, the subblocks having a duration equal to one PN frame; this addition step will mean that the corresponding sample numbers of each of the subblocks are added to one another.

c) for each compressed block, performing a matched filtering operation, which utilizes fast convolution techniques, to determine the relative timing between the received PN code contained within the block of data and a locally generated PN reference signal (e.g. the pseudorandom sequence of the GPS satellite being processed).

d) determining a pseudorange by performing a magnitude-squared operation on the products created from said matched filtering operation and post processing this by combining the magnitude-squared data for all blocks into a single block of data by adding together the blocks of magnitude-squared data to produce a peak.

and e) finding the location of the peak of said single block of data to high precision using digital interpolation methods, where the location is the distance from the beginning of the data block to the said peak, and the location represents a pseudorange to a GPS satellite corresponding to the pseudorandom sequence being processed.

Typically, the fast convolution technique used in processing the buffered GPS signals is a Fast Fourier Transform (FFT) and the result of the convolution is produced by computing the product of the forward transform of the compressed block and a prestored representation of the forward transform of the pseudorandom sequence to produce a first result and then performing an inverse transformation of the first result to recover the result. Also, the effects the Doppler induced time delays and local oscillator induced time errors are compensated for on each compressed block of data by inserting between the forward and inverse Fast Fourier Transform operations, the multiplication of the forward FFT of the compressed blocks by a complex exponential whose phase versus sample number is adjusted to correspond to the delay compensation required for the block.

In the foregoing embodiment the processing of GPS signals from each satellite occurs sequentially over time, rather than in parallel. In an alternative embodiment, the GPS signals from all in view satellites may be processed together in a parallel fashion in time.

It is assumed here that the basestation 10 has a common view of all satellites of interest and that it is sufficiently close in range to remote unit 20 in order to avoid ambiguities associated with the repetition period of the C/A PN code. A range of 90 miles will satisfy this criteria. The basestation 10 is also assumed to have a GPS receiver and a good geographical location such that all satellites in view are continuously tracked to high precision.

While several described embodiments of the basestation 10 show the use of a data processing component, such as a computer at the basestation in order to compute position information such as a latitude and a longitude for the mobile GPS unit, it will be appreciated that each basestation 10 may merely relay the information received, such as pseudoranges from a mobile GPS unit, to a central location or several central locations which actually perform the computation of latitude and longitude. In this manner the cost and complexity of these relaying basestations may be reduced by eliminating a data processing unit and its associated components from each relaying basestation. A central location, would include receivers (e.g. telecommunication receivers) and a data processing unit and associated components. Moreover, in certain embodiments, the basestation may be virtual in that it may be a satellite which transmits Doppler information to remote units, thereby emulating a basestation in a transmission cell.

FIGS. 5A and 5B show two embodiments of a basestation according to the present invention. In the basestation shown in FIG. 5A, a GPS receiver 501 receives GPS signals through a GPS antenna 501a. The GPS receiver 501, which may be a conventional GPS receiver, provides a timed reference signal which typically is timed relative to GPS signals and also provides Doppler information relative to the satellites in view. This GPS receiver 501 is coupled to a disciplined local oscillator 505 which receives the time reference signal 510 and phase locks itself to this reference. This disciplined local oscillator 505 has an output which is provided to a modulator 506. The modulator 506 also receives Doppler data information signals for each satellite in view of the GPS mobile unit and/or other satellite data information signals 511. The modulator 506 modulates the Doppler and/or other satellite data information onto the local oscillator signal received from the discipline local oscillator 5 in order to provide a modulated signal 513 to the transmitter 503. The transmitter 503 is coupled to the data processing unit 502 via interconnect 514 such that the data processing unit may control the operation of the transmitter 503 in order to cause the transmission of satellite data information, such as the Doppler information to a GPS mobile unit via the transmitter's antenna 503a. In this manner, a GPS mobile unit may receive the Doppler information, the source of which is the GPS receiver 501 and may also receive a high precision local oscillator carrier signal which may be used to calibrate the local oscillator in the GPS mobile unit as shown in FIG. 6.

The basestation as shown in FIG. 5A also includes a receiver 504 which is coupled to receive communication signals from the remote or GPS mobile unit via a communication antenna 504a. It will be appreciated that the antenna 504a may be the same antenna as the transmitter's antenna 503a such that a single antenna serves both the transmitter and the receiver in the conventional fashion. The receiver 504 is coupled to the data processing unit 502 which may be a conventional computer system. The processing unit 502 may also include an interconnect 512 to receive the Doppler and/or other satellite data information from the GPS receiver 511. This information may be utilized in processing the pseudorange information or other information received from the mobile unit via the receiver 504. This data processing unit 502 is coupled to a display device 508, which may be a conventional CRT. The data processing unit 502 is also coupled to a mass storage device 507 which includes GIS (Geographical Information System) software (e.g. Atlas GIS from Strategic Mapping, Inc. of Santa Clara, Calif.) which is used to display maps on the display 508. Using the display maps, the position of the mobile GPS unit may be indicated on the display relative to a displayed map.

An alternative basestation shown in FIG. 5B includes many of the same components shown in FIG. 5A. However, rather than obtaining Doppler and/or other satellite data information from a GPS receiver, the basestation of FIG. 5B includes a source of Doppler and/or other satellite data information 552 which is obtained from a telecommunication link or a radio link in a conventional matter. This Doppler and/or satellite information is conveyed over an interconnect 553 to the modulator 506. The other input the modulator 506 shown in FIG. 5B is the oscillator output signal from a reference quality local oscillator such as a cesium standard local oscillator. This reference local oscillator 551 provides a precision carrier frequency onto which is modulated the Doppler and/or other satellite data information which is then transmitted via transmitter 503 to the mobile GPS unit.

FIG. 6 shows an embodiment of a GPS mobile unit of the present invention which utilizes the precision carrier frequency signal received through the communication channel antenna 601 which is similar to the antenna 24 shown in FIG. 1A. The antenna 601 is coupled to the modem 602, which is similar to the modem 22 in FIG. 1A, and this modem 602 is coupled to an automatic frequency control circuit 603 which locks to the precision carrier frequency signal sent by the basestation described herein according to one embodiment of the present invention. The automatic frequency control circuit 603 provides an output 604, which is typically locked in frequency to the precision carrier frequency. This signal 604 is compared by the comparator 605 to the output of the GPS local oscillator 606, via interconnect 608. The result of the comparison performed by the comparator 605 is an error correction signal 610 which is provided to the frequency synthesizer 609. In this manner, the frequency synthesizer 609 provides a higher quality, calibrated local oscillation signal over interconnect 612 to the GPS down converter 614. It will be appreciated that the signal provided over interconnect 612 is similar to the local oscillator signal provided by interconnect 39 on FIG. 1A to the converter 42; also, the converter 42 is similar to the GPS down converter 614 which is coupled to the GPS antenna 613 to receive GPS signals. In an alternative embodiment, the result of the comparison performed by comparator 605 may be output via interconnect 610a as an error correction to the DSP component 620 which is similar to the DSP chip 32 shown in FIG. 1A. In this instance, no error correction signal 610 will be provided to the frequency synthesizer 609. The automatic frequency control circuit may be implemented using a number of conventional techniques including a phase lock loop or a frequency lock loop or a block phase estimator.

FIG. 7 illustrates a particular sequence of power management according to one embodiment of the invention. It will be appreciated that there are numerous ways which are known in the art in order to reduce power. These include slowing down the clock provided to a synchronous, clocked component as well as completely shutting down power to a particular component or turning off certain circuits of a component but not others. It will be appreciated, for example, that phase lock loops and oscillator circuits require start up and stabilization times and thus a designer may decide not to power down completely (or at all) these components. The example shown in FIG. 7 begins in step 701 in which the various components of the system are initialized and placed in a reduced power state. Either periodically or after a predetermined period of time, the communication receiver in the modem 22 is returned to full power to determine whether commands are being sent from the basestation 10. This occurs in step 703. If a request is received in step 705 for location information from a base unit, the modem 22 alerts the power management circuit in step 707. At this point in time, the communication receiver in the modem 22 may be turned off for either a predetermined period of time or turned off to be turned on periodically again at a later time; this is shown as step 709. It will be appreciated that the communication receiver may maintained at a full power state rather than turning it off at this point in time. Then in step 711, the power management circuit returns the GPS receiver portion of the mobile unit to full power by powering up the converter 42 and the analog to digital converters 44; if the frequency oscillator 38 was also powered down, this component is powered up at this time and returned to full power and allowed some time to stabilize. Then in step 713, the GPS receiver, including components 38, 42 and 44 receive the GPS signal. This GPS signal is buffered in the memory 46 which has also been returned to full power when the GPS receiver was returned to full power in step 711. After collection of the snapshot information is completed, then the GPS receiver is returned to a reduced power state in step 717; this typically comprises reducing power for the converter 42 and 44 while keeping the memory 46 at full power. Then in step 719, the processing system is returned to full power; in one embodiment, this involves providing full power to the DSP chip 32; it will be appreciated however that if the DSP chip 32 is also providing power management functions as in the case of the embodiment shown in FIG. 1C, then the DSP chip 32a is typically returned to full power in step 707. In the embodiment shown in FIG. 1A where the microprocessor 26 performs power management function, the processing system, such as DSP chip 32 may be returned to full power at step 719. In step 721, the GPS signal is processed according to the method of the present invention, such as that shown in FIG. 3. Then, after completing the processing of the GPS signal, the processing system is placed in a reduced power state as shown in step 23 (unless the processing system is also controlling power management as noted above). Then, in step 725 the communication transmitter in the modem 22 is returned to full power in order to transmit in step 727 the processed GPS signal back to the basestation 10. After completing transmission of the processed GPS signal, such as pseudorange information or latitude and longitude information, the communication transmitter is returned to reduced power state in 729 and the power management system waits for a delay of a period of time such as predetermined period of time in step 731. Following this delay the communication receiver in the modem 22 is returned to full power in order to determine whether a request is being sent from a basestation.

Although the methods and apparatus of the present invention have been described with reference to GPS satellites, it will be appreciated that the teachings are equally applicable to positioning systems which utilize pseudolites or a combination of satellites and pseudolites. Pseudolites are ground based transmitters which broadcast a PN code (similar to a GPS signal) modulated on an L-band carrier signal, generally synchronized with GPS time. Each transmitter may be assigned a unique PN code so as to permit identification by a remote receiver. Pseudolites are useful in situations where GPS signals from an orbiting satellite might be unavailable, such as tunnels, mines, buildings or other enclosed areas. The term "satellite", as used herein, is intended to include pseudolite or equivalents of pseudolites, and the term GPS signals, as used herein, is intended to include GPS-like signals from pseudolites or equivalents of pseudolites.

In the preceding discussion the invention has been described with reference to application upon the United States Global Positioning Satellite (GPS) system. It should evident, however, that these methods are equally applicable to similar satellite positioning systems, and in, particular, the Russian Glonass system. The Glonass system primarily differs from GPS system in that the emissions from different satellites are differentiated from one another by utilizing slightly different carrier frequencies, rather than utilizing different pseudorandom codes. In this situation substantially all the circuitry and algorithms described previously are applicable with the exception that when processing a new satellite's emission a different exponential multiplier is used to preprocess the data. This operation may be combined with the Doppler correction operation of box 108 FIG. 3, without requiring any additional processing operations. Only one PN code is required in this situation, thus eliminating block 106. The term "GPS" used herein includes such alternative satellite positioning systems, including the Russian Glonass system.

Although FIGS. 1A, 1B and 1C illustrate a multiplicity of logic blocks that process digital signals (e.g. 46, 32, 34, 26, 30, 28 in FIG. 1A), it should be appreciated that several or all of the these blocks may be integrated together onto a single integrated circuit, while still maintaining the programmable nature of the DSP portion of such a circuit. Such an implementation may be important for very low power and cost sensitive applications.

It should also be appreciated that one or several of the operations of FIG. 3 may be performed by hardwired logic in order to increase the overall processing speed, while retaining the programmable nature of the DSP processor. For example, the Doppler correction capability of block 108 may be performed by dedicated hardware that may be placed between the digital snapshot memory 46 and the DSP IC 32. All other software functions of FIG. 3 may in such cases be performed by the DSP processor. Also, several DSPs may be used together in one remote unit to provide greater processing power. It will also be appreciated that it is possible to collect (sample) multiple sets of frames of GPS data signals and process each set as shown in FIG. 3 while accounting for the time between the collection of each set of frames.

A demonstration system, which is an example of an embodiment of the present invention, has been constructed that has verified the operation of the methods and algorithms described herein as well as showing the improved sensitivity possible by using these methods and algorithms. The demonstration system consisted of a GPS antenna and RF downconverter from GEC Plessey Semiconductors followed by a digitizer buffer board from Gage Applied Sciences, Inc. The antenna and downconverter perform the functions of 38, 40, 42, and 44 of FIG. 1A and the digitizer buffer performs the functions 44, 46 and 48 of FIG. 1A. The signal processing was performed on an IBM PC compatible computer using a Pentium microprocessor, running under Windows 95 operating system. This emulated the functions of the DSP chip 32 and the memory peripherals 34. Doppler information for satellites in view were provided to the signal processing software as inputs to the signal processing routines to emulate the functions of the modem and microprocessor 22, 24, 25, 26.

The algorithms for this demonstration system were developed using the MATLAB programming language. A large number of tests were performed on live GPS signals obtained in various situations of blockage. These tests have verified that the sensitivity performance of the demonstration system was substantially superior to that of several commercial GPS receivers, that were tested at the same time. Appendix A provides a detailed listing of the MATLAB machine code that was used in these tests and is an example of the fast convolution operations of the present invention (e.g. FIG. 3).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

APPENDIX A

```
function [sv,prange,snrin,snrout,svdoppler,outdata]=
            gps(filename,srate,codes,doppler, no_pred,samplerange)
%
%function
%[sv,prange,snrin,snrout,svdoppler,outdata]=gps(filename,srate,codes,doppler,
%no_pred,samplerange)
%
% N. Krasner Feb. 20, 1996.
% ©Precision Tracking, Inc., San Jose, CA. 95117
%
%This function processes digitized data and provides pseudoranges as outputs
%together with other statistical quanitites, as described below.
%
%Data to be processed is stored in a file named 'filename'.
%
%This function works on data from Gage digitizer at either sample rate
%3X2.048 MHz (if srate==0) or at sample rate 6X2.048 MHz (if srate==1).
%where it is assumed that IF is 35.42 -(1400/45)=4.308889 MHz.
%The following are definitions of inputs and outputs of the routine:
%
%Codes are the SV numbers;   if codes=0, then all codes will be used;
%
%Doppler = [dopper(1) doppler(2) ... doppler(n) span], specifies the mean
%doppler of each of the n satellite plus a span to be searched over;  if span
%is missing or=0), then search is only done at the specified dopplers.
%An algorithm is used to select the quantization size of doppler steps.
%In some cases even if span is nonzero, only one doppler frequency per
%satellite %will be used.  The search range is ±span relative to each doppler.
%
%no_pred is number of predetection frames
%
%All data in the file is processed if samplerange is deleted. However, if
%it is present it is two value and has the notation:
%           samplerange=[lower_index, upper_index];
%If these indices are not within range of that provided in the gage file,
%then an error message is provided.
%
%Defaults are:  if doppler has only one value, then doppler_span will be zero
%               if no_postd is not specified, then all data will be used
%               if no_pred is not specified, then pred will be set to 9
%               if no_pred is specified, then no_postd must be specified
%
%Outputs are codenumbers, pseudranges, snrs and best doppler
%with the pseudoranges expressed in nsec and snrs in dB.
%A signal peak must exceed 15 dB threshold for detection. An
%interpolation algorithm is used to determine signal peak location.
%If no codes are found, the the returned function will be all zeros.
%
%Outdata is a vector of size 2048 that represents the output signal plus
%noise after postdetection integration for each detected satellite vehicle,
%for the best doppler. This data was used to find pseudoranges %%%%% ----------------------------------------------------------%%%%
%First open the file and find the buffersize and indices to
```

```
%process, which may be all data if not specified in input arguments

[filevals,rate]=gageopen(filename);
buffsize=filevals(3);     %total number of samples in file
if nargin==6,
    lower_index=samplerange(1);upper_index=samplerange(2);
    if upper_index>buffsize-1,
        error('Samplerange is out of bounds');
    end
else,
    lower_index=0;upper_index=buffsize-1;
end

%%%%---------------------------------------------------------------%%%

%Now find number of doppler bins;  the center of these bins are
%called dopps and they are referenced to the center of the input dopplers if length(doppler)==length(codes), span==0;
elseif length(doppler)==length(codes)+1,
    span=doppler(length(codes)+1);
else,
    error('Length of doppler vector must equal length of codes, or 1 more');
end
if span<0, error('Span must be greater than zero');end if srate==0, s_per_frame=6;else, s_per_frame=12;end if nargin==3, no_pred=min(9,fix(buffsize/(1024*s_per_frame)));end
no_postd=fix(buffsize/(no_pred*1024*s_per_frame));
if no_pred<1, error('Number of predetection frames must be at least 1');end
if no_postd<1, error('Number of postdetection frames must be at least 1');end deltaf=(1/3)*1000/no_pred;    %yields about 1.5 dB loss which is made up
                              %worst case by two independent detections for
                              %when true freq is midway between bins if span<deltaf,
    dopps=0;    %no need to quantize doppler
else,
    dopps=[0:-deltaf:-span];
    dopps=sort([dopps deltaf:deltaf:span]);
end %%% ----------------------------------------------------------------%%%
%Now get the FFT of codes and put them in a matrix of size length(codes)X2048 if codes==0, codes=1:28;end                  %search all codes in this case
codearray=zeros(length(codes),2048);
for k=1:length(codes),
    codearray(k,:)=gps_resampled(codes(k));
end

%%% ----------------------------------------------------------------%%%

%In the following we input data in blocks equal to a number of PN
%frames equal to no_pred.  For example if no_pred=7, the the number
%of samples from the gage is 2048*3*7=43008, so that in this case
```

%a full 4 Mbyte collection would take about 93 iterations. Each
%iteration then performs the pred summation, cross-correlation, mag-
%squared operation and summation with previous blocks for all dopplers
%and all satellite vehicles specified.

```
blocksize=1024*s_per_frame*no_pred;

start=lower_index-blocksize;
lc=length(codes);ld=length(dopps);
prdata=zeros(lc*ld,2048);
no_blocks=fix((buffsize-10*s_per_frame)/blocksize);   %extra  60 or 120
samples
                                  %for overlap-save allows impulse response to
                                  %60 or 120; see if_2_base m-file
for n=1:no_blocks,
  start=start+blocksize;
  [data,count]=gageread(filevals,start,blocksize+10*s_per_frame);
  data=if_2_base(data,srate);     %Converts data to baseband and decimates to
                                  %2.048 MHz
  data=data(21:20+2048*no_pred);  %reject edge effect data (overlaps save)
  for k=1:lc,         %Iterate over SV
     ref=codearray(k,:);          %code to be used for SV code(k)
     for d=1:ld,      %Iterate over dopplers
        df=doppler(k)+dopps(d);
        rdata=data.*exp(-j*2*pi*df*[0:2048*no_pred-1]/2.048e6);
        rdata=sum(reshape(rdata,2048,no_pred)');   %does pred summation
        rdata=fft(rdata).*ref;                     %does matched filter
           %compensate for time slip per block which is fdopp/fo times time
           %noting that fdoop/fo is doppler time slip per second
        timeslip=1e-3*no_pred*df/1575.42e6;
        phase=exp(-j*2*pi*timeslip*(n-1)*[0:1024]*1e3);
        rdata(1:1025)=rdata(1:1025).*phase;
        rdata(1026:2048)=rdata(1026:2048).*conj(phase(1024:-1:2));
        rdata=ifft(rdata);
        rdata=real(rdata).^2+imag(rdata).^2;       %magnitude
        prdata((k-1)*ld+d,:)=prdata((k-1)*ld+d,:)+rdata;
     end
  end
end

%%% ------------------------------------------------------------------%%% sv=[];,prange=[];,snrin=[];snrout=[];svdopper=[];outdata=[];
%Now we look for peaks exceeding threshold for k=1:lc,        %look at all SV's and dopps
   z=prdata((k-1)*ld+[1:ld],:);    %data matrix for sv#k and all dopplers
   z=z-mean(mean(z));
   noise=sqrt(mean(mean(z.^2)));        %coarse noise rms
   threshold=5.7*noise;
                                  %yields Pfa less than 1e-4 per using all
                                  %28 sv's and 10 dopplers per SV
   indt=find(z<threshold);
   noise=sqrt(mean(mean(z(indt).^2)));  %refined noise getting rid of signal
   d=z+0.2*max(mrotate(z,-1),mrotate(z,1)); %detection stat. eliminating
                                            %picket fence problem
   [maxd,indd]=max(d');   %finds max and location for each doppler
```

```
        [maxsv,indsv]=max(maxd);    %find global peak for this sv
      if maxsv>threshold,           %then we detect this sv!
        r=(maxsv/noise)^2;          %peak to noise away from peak
        snin=sqrt(r/(no_pred^2*no_postd));    %snrin via N.K analysis
        snrin=[snrin 10*log10(snin)];
                                    %now find snrout at peak
        snout=(no_pred^2*no_postd)*snin^2/(1+2*no_pred*snin);  %via N.K anal.
        snrout=[snrout 10*log10(snout)];

sv=[sv codes(k)];
        d=z(indsv,:);               %data for best doppler
        outdata=[outdata d];
        svdoppler=[svdoppler doppler(k)+dopps(indsv)];  %best doppler
        ind0=indd(indsv);           %best sample for best
        inds0=[ind0-4:ind0+4];      %block of 9 data samples about ind0;
        ninds=find(inds0<=0);
        pinds=find(inds0>2048);
        if length(ninds)>0,         %keep data to interpolate within range
            inds0(ninds)=inds0(ninds)+2048;
        elseif length(pinds)>0,
            inds0(pinds)=inds0(pinds)-2048;
        end
        dint=interp(d(inds0),10);   %go to rate 20 MHz
        dint=interp(dint,10);       %go to rate 200 MHz
        dint=interp(dint,5);        %go to rate 1 GHz
        [amax,imax]=max(dint);      %find max
        indmax=min(find(dint>0.8*amax));  %max above 80%
        tmax=ind0+(indmax-2001)/500;      %pseudorange in samples
        if tmax>=2048,
            tmax=tmax-2048;
        elseif tmax<0,
            tmax=tmax+2048;
        end
        tmax=tmax*500;              %pseudorange in units of nsec
        prange=[prange tmax];
      end
end if length(sv)==0,                   %then there were no detections
    sv=0;prange=0;snrin=0;snrout=0;svdoppler=0;outdata=0;
end fclose('all');

function y=gpscodes(num)
%y=gpscodes(num)
%
% N. Krasner Jan. 22, 1996.
% ©Precision Tracking, Inc., San Jose, CA. 95117
%
%Returns all 1023 bit codes associated with satellite in an
%array y of size 37X1023. Each row is the code associated
%with the satellite having the corresponding ID number. That
%is row 1 is the PN (Gold) code of satellite 1, etc.
%
%If num is specified then only one code with that number is
```

```
%returned y1=pngen([3,10],1023,ones(1,10));
y2=pngen([2,3,6,8,9,10],1023,ones(1,10));

delays=[5,6 7,8,17,18,139,140,141,251,252,254,255,256,257,258];
delays=[delays,469,470,471,472,473,474,509 512,513,514,515,516];
delays=[delays, 859 860 861 862 863 950 947 948 950];

if nargin==0,
  for k=1:length(delays),
      y(k,:)=xor(y1,rotate(y2,delays(k)));
  end
  else,
    y=xor(y1,rotate(y2,delays(num)));
end function z=gps_rsmp(codenumber)
%
% N. Krasner Feb. 16, 1996.
% ©Precision Tracking, Inc., San Jose, CA. 95117
%
%Returns the resampled Fourier transform of specified 1023 bit
%GPS code, resampled to at rate 2048 kHz and weighted
%with a "sinc" function to emulate the transform of the
%sequences consisting of a set of square pulses, which
%is ideally bandpass filtered to the first nulls (±1023 kHz).
%
%If codenumber is 0, then all gps codes are returned in a matrix
%of size 37X2048.
%
%The transformed data contains real and imaginary components
%each of which is rounded to 4 bit signed integers in the range
%[-7,7]. This is the form stored in EPROM. This quanitization
%minimizes required storage, but results in negligible loss of
%performance.
%
%As in the function gpscodes, the returned value contains 37
%rows each corresponding to the corresponding GPS code (row 1
%contains code 1, etc.) if all codes are requested.Each row is
%of length 2048 and, as stated above contains complex words whose
%components are integers in the range [-15,15].
%
%Note that this function calls the function gpscodes to create
%the various Gold codes.

if codenumber==0,
    y=gpscodes;
else,
    y=gpscodes(codenumber);
end

%returns matrix 37X1023 of GPS codes
y=2*y-1;                                        %convert to ±1 if codenumber==0,
  z=zeros(37,2048);
```

```
   for k=1:37,
     fy1=fft(stretch(y(k,:),2));
     fy11=[fy1(1:1024).*sinc([0:1023]/1023) 0 0];
     fy11=[fy11 fy1(1025:2046).*sinc([1022:-1:1]/1023)];
     z(k,:)=conj(fy11);     %need conjugate for matched filter
   end
 else,
   fy1=fft(stretch(y,2));
   fy11=[fy1(1:1024).*sinc([0:1023]/1023) 0 0];
   fy11=[fy11 fy1(1025:2046).*sinc([1022:-1:1]/1023)];
   z=conj(fy11);     %need conjugate for matched filter
 end
end z=round(z/20);     %since max is 171.9 but few values are above 140
rz=min(real(z),7);rz=max(rz,-7);     %limit range
iz=min(imag(z),7);iz=max(iz,-7);     %limit range
z=rz+j*iz;

function data_out=if_2_base(data_in,rate)
%data_out=if_2_base(data_in)
%
% N. Krasner Feb. 20, 1996.
% ©Precision Tracking, Inc., San Jose, CA. 95117
%
%
%If rate is missing or equals 0, then the input rate is assumed
%to be 3*2048 kHz.  If rate equals 1, then it is 6*2048 kHz.
%
%Converts data from GAGE digitizer sampled at either 3*2048 kHz
%or 6*2048 kHz with IF 6.144 MHz (3*2.048) centered at
%35.42 -(1400/45)=4.308889 MHz to a complex (I,Q) stream
%of data with sample rate 2.048 MHz centered at 0
%frequency (nominally). This routine does not compensate for
%any doppler shifts on SV's, nor any LO drifts. Note that the output
%data length is either 1/3 or 2/3 that of the input.

if nargin==1, rate=0;end
ifreq = 35.42 - (1400/45);     %in MHz if rate==0,               %case where sample rate is 3*2048 kHz
    srate=3*2.048;      % in MHz    %sample rate for GAGE
    [u,v]=size(data_in);if u>v;data_in=data_in';end;ld=length(data_in);
    c=exp(-j*2*pi*[0:ld-1]*ifreq/srate);     %LO
    data_out=data_in.*c; clear data_in c                %convert to 0
    h=fir1(50,.9/3.072);
    data_out=filter(h,1,data_out);          %filter to ±1 MHz
    data_out=data_out(1:3:ld);     %decimate to yield 2.048 MHz srate
else,                     %case where sample rate is 6*2048 kHz
    srate=6*2.048;      % in MHz
    [u,v]=size(data_in);if u>v;data_in=data_in';end;ld=length(data_in);
    c=exp(-j*2*pi*[0:ld-1]*ifreq/srate);     %LO
    data_out=data_in.*c; clear data_in c                %convert to 0
    h=fir1(100,.9/6.144);
    data_out=filter(h,1,data_out);          %filter to ±1 MHz
    data_out=data_out(1:6:ld);     %decimate to yield 2.048 MHz srate
```

```
end function y=mrotate(x,m)
%y=mrotate(x,m);   matrix rotation by m units
%
% N. Krasner Feb. 20, 1996.
% ©Precision Tracking, Inc., San Jose, CA. 95117
m=round(m);
m=rem(m,lx);
if m>0,
    y=[x(:,lx-m+1:lx) x(:,1:lx-m)];
elseif m<0,
    y=[x(:,1-m:lx) x(:,1:-m)];
else,
    y=x;
end function y=pngen(taps,npts,fill)
%pngen(taps,npts,fill)
%
% N. Krasner Feb. 13, 1995.
% ©Norman F. Krasner, San Carlos, CA. 94070
%
% PNGEN generates "npts" number of points of the psuedo random
%       sequence defined by a shift register of length n with feedback
taps
%                      'taps' and initial fill 'fill'. PN(npts, taps,
fill) returns a
%       vector of length npts containing this sequence.
%                      A typical example [1,6,8,14] for R14, fill=[1
zeros(1,13)]
%
%    If a single number is given in "taps" it is interpreted as
%       the octal value specifying the taps, as in Peterson and Weldon.
For
%    example a code 2767 (octal) = 010 111 110 111. We delete the
leading 0
%    to get the polynomial 10 111 110 111. The feedback taps for this
case
%    are found by ignoring the first one and choosing the remaining
"ones"
%    to get position. For this case the taps are thus 2 3 4 5 6 8 9 10.

if length(taps)==1,
    taps=sprintf('%.0f',taps);ntaps=[];

if taps(1)=='1', ntaps=      [1] ;
    elseif taps(1)=='2', ntaps=[ 1 0 ];
    elseif taps(1)=='3', ntaps=[1 1 ];
    elseif taps(1)=='4', ntaps=[1 0 0 ];
    elseif taps(1)=='5', ntaps=[1 0 1 ];
    elseif taps(1)=='6', ntaps=[1 1 0 ];
    elseif taps(1)=='7', ntaps=[1 1 1 ];
    end
```

```
    for k=2:length(taps)
        if       taps(k)=='0', ntaps=[ntaps 0 0 0 ];
        elseif taps(k)=='1', ntaps=[ntaps 0 0 1 ];
        elseif taps(k)=='2', ntaps=[ntaps 0 1 0 ];
        elseif taps(k)=='3', ntaps=[ntaps 0 1 1 ];
        elseif taps(k)=='4', ntaps=[ntaps 1 0 0 ];
        elseif taps(k)=='5', ntaps=[ntaps 1 0 1 ];
        elseif taps(k)=='6', ntaps=[ntaps 1 1 0 ];
        elseif taps(k)=='7', ntaps=[ntaps 1 1 1 ];
        end
    end
    ntaps(1)=[];
    taps=find(ntaps);
end n=max(taps);

if nargin<=2, fill=[1 zeros(1,n-1)];end
if nargin==1, npts=(2^n)-1;end
y = zeros(1,npts);
x = zeros(1,n);
x = fill(length(fill):-1:1);
for i=1:npts
   y(i) = x(n);
   x=[rem(sum(x(taps)),2), x(1:n-1)];
end function [file_vals, sample_rate] = gageopen(filename)
% Read gage formatted file, with particular number of samples
%     function [file_vals, sample_rate] = gageopen(filename)
%
% B. Wilson Jan. 13, 1996.
% ©Precision Tracking, Inc., San Jose, CA. 95117 file_vals(1) = fopen(filename,'r');

[sample_rate, sample_depth, head_vals, operation_mode] =
rdgghead(file_vals(1));

file_vals(2) = operation_mode;
file_vals(3) = sample_depth;
file_vals(4:6) = head_vals(1:3)

function [buf, count] = gageread(file_vals,start,numsamples)
% Read gage formatted file, with particular number of samples
%     function [buf, count] = gageread(file_vals,start,numsamples)
% B. Wilson Jan. 13, 1996.
% ©Precision Tracking, Inc., San Jose, CA. 95117

% files_vals
%     1 - file id
%     2 - operation_mode - if =1; file is memory image interleave
sample_depth long; =2 memory image
%     3 - sample_depth
```

```
%
ns2 = numsamples/2;
fid = file_vals(1);
if (file_vals(2) == 2)
      buf = zeros(numsamples,1);
      fresult = fseek(fid,512+start,-1);  % move to requested point in
data portion of file
      [buf, count] = fread(fid, numsamples, 'uchar');
else
      buf = zeros(ns2,2);
      fresult = fseek(fid,512+(start/2),-1);   % move to requested
point in data portion of file
      [buf(:,1), c1] = fread(fid, ns2, 'uchar');
      fresult = fseek(fid,512+(start/2)+file_vals(3),-1);   % move to
BANK B, portion of memory image
      [buf(:,2), c2] = fread(fid, ns2, 'uchar');
      count = c1 + c2;
      buf = reshape(buf',numsamples,1);
end
%
buf = buf - 128;

function [sample_rate, sample_depth, head_vals, operation_mode] =
rdgghead(fid)
% Read gage formatted header
% B. Wilson Jan. 13, 1996.
% ©Precision Tracking, Inc., San Jose, CA. 95117
%
%
%
%sample_rate =
[1,2,5,10,20,50,100,200,500,1000,2000,5000,10000,20000,50000];
sample_rate_table =
[1,2,4,5,10,12.5,20,25,30,40,50,60,100,120,125,150,200,250];
%
fresult = fseek(fid,0,-1);    % rewind the file
%
tmp = fread(fid,14,'char');
s = setstr(tmp');
%
fresult = fseek(fid,16,-1);   % move to name variable
tmp = fread(fid,9,'char');
sname = setstr(tmp');
%
fresult = fseek(fid,287,-1);   % move to index to sample rate table
variable
sample_rate_index = fread(fid,1,'int16');
if (sample_rate_index == 42)         % 42 is 'external'
     sample_rate = -1;
else
     sample_rate = sample_rate_table(sample_rate_index - 17);
end
%
fresult = fseek(fid,289,-1);  % move to index to operation mode variable
operation_mode = fread(fid,1,'int16')
%% if(operation_mode == 1)
```

```
%%      sample_rate = sample_rate / 2;
%% end
%
fresult = fseek(fid,301,-1);   % move to sample_depth variable
sample_depth = fread(fid,1,'int32')
if(operation_mode == 1)
    sample_depth = sample_depth / 2  % seems like a 'bug' to me
    if (sample_depth == 4194304)
        sample_depth = sample_depth /2
    end
end;
%
fresult = fseek(fid,313,-1);   % move to starting_address
head_vals = fread(fid,3,'int32');
%
fresult = fseek(fid,339,-1);   % move to sample_depth variable
resolution_12_bits = fread(fid,1,'int16');
%
fresult = fseek(fid,345,-1);   % move to sample_depth variable
sample_offset = fread(fid,1,'int16');
%
fresult = fseek(fid,349,-1);   % move to sample_depth variable
sample_bits = fread(fid,1,'int16');

function y=rotate(x,q)
%y=rotate(x,q)
%Rotates vector by q places
% N. Krasner Nov. 28, 1995.
% ©Norman Krasner, San Carlos, CA. 94070

%If q is deleted this rotates a vector by interchanging the first and last half
%of the vector.  If the vector is odd in length the mid point is
%placed at the beginning of the new vector.
%
%If q is present and >0 this rotates the vector x right by q positions;
e.g.
%if x=[1 1 0 1 0], then rotate(x,2) yields y=[1 0 1 1 0].  If q is <0 then
%this rotates x to the left.

[m,n]=size(x);mn=max(m,n);
if nargin>1,q=rem(q,mn);end if m>1 & n>1, error('This function works only for vectors, not matrices.');end
if m>1,x=x';end if nargin==1,
    if rem(mn,2)==0,
        pivot=1+mn/2;
    else pivot=(mn+1)/2;
    end
    y=[x(pivot:mn) x(1:pivot-1)];
elseif abs(q)>0,
    if q<0, q=q+mn;end                      %fix for shifts left
        y=[x(mn-q+1:mn)   x(1:mn-q)];
```

```
        else y=x;
      end
  end
  if m>1,y=y';end function z=sinc(x)
  %z=sinc(x)
  % N. Krasner April 21, 1991
  % ©Norman Krasner, San Carlos, CA. 94070
  %
  %Definition:    sinc(x) = sin(pi*x)/(pi*x), where x is a vector/matrix.
  %sinc(x)=1 if x=0 ind1=find(x==0);
  ind2=find(x~=0);
  z=x;
  x(ind1)=ones(1,length(ind1));
  x(ind2)=sin(pi*x(ind2))./(pi*x(ind2));
  z(:)=x;

function z=stretch(signal,period)
  %function z=stretch(signal,period)
  %
  % N. Krasner March 12, 1995
  % ©Norman Krasner, San Carlos, CA. 94070

%This function stretchs a signal by replacing each element
  %with m identical elements;  m is specified by "period."

[u,v]=size(signal);
  if u>1 & v>1 error('This function works only for vector inputs.'); end
  if u>1, signal=signal';end
  a=ones(period,1)*signal;
  z=a(:)';z=conj(z);
  if u>1, z=conj(z');end function y=xor(a,b);
  %function y=xor(a,b);
  %Exclusive or, term by term, of two vectors
  % N. Krasner June 13, 1994
  % ©Norman Krasner, San Carlos, CA. 94070 y=(a&~b )| (b&~a);
```

I claim:

1. A GPS receiver apparatus, comprising:

an antenna for receiving GPS signals at an RF frequency from in view satellites;

a downconverter coupled to said antenna, said downconverter reducing the RF frequency of said received GPS signals to an intermediate frequency (IF);

a digitizer coupled to said downconverter and receiving said IF GPS signals, said digitizer sampling said IF GPS signals at a predetermined rate to produce sampled IF GPS signals;

a memory coupled to said digitizer, said memory storing the sampled IF GPS signals; and a digital signal processor (DSP) coupled to said memory, said DSP performing fast convolution, wherein said digital signal processor processes said sampled IF GPS signals by performing a plurality of fast convolutions on a corresponding plurality of blocks of said sampled IF GPS signals to provide a plurality of corresponding results of each fast convolution and summing a plurality of mathematical representations of said plurality of corresponding results to obtain a first position information.

2. A GPS receiver as in claim 1 further comprising a communication antenna and a receiver coupled to said communication antenna and to said DSP, said receiver for receiving a data signal containing satellite data information.

3. A GPS receiver as in claim 2 wherein said satellite data information comprises a Doppler information of a satellite in view of said GPS receiver.

4. A GPS receiver as in claim 3 wherein said satellite data information comprises an identification of a plurality of satellites in view of said GPS receiver and a corresponding plurality of Doppler information for each satellite of said plurality of satellites in view of said GPS receiver.

5. A GPS receiver as in claim 2 wherein said satellite data information comprises data representative of ephemeris for a satellite.

6. A GPS receiver as in claim 1 further comprising:

a local oscillator coupled to said downconverter, said local oscillator providing a first reference signal.

7. A GPS receiver as in claim 2 further comprising a local oscillator coupled to said downconverter, said local oscillator providing a first reference signal and wherein said receiver receives a precision carrier frequency signal which is used to calibrate said first reference signal from said local oscillator, wherein said local oscillator is used to acquire GPS signals.

8. A GPS receiver as in claim 3 wherein said DSP compensates said sampled IF GPS signals using said Doppler information.

9. A GPS receiver as in claim 1 further comprising a power management circuit coupled to said downcoverter and to said digitizer, wherein after said IF GPS signals are stored in said memory, said power management circuit reduces power consumed by said downconverter and said digitizer.

10. A GPS receiver as in claim 8 further comprising a transmitter coupled to said DSP, said transmitter for transmitting said pseudorange information.

11. A GPS receiver as in claim 2 further comprising a transmitter coupled to said DSP said transmitter for transmitting a latitude and longitude information.

12. A method for using a GPS receiver, said method comprising:

receiving GPS signals from in view satellites;

digitizing said GPS signals at a predetermined rate to produce sampled GPS signals;

storing said sampled GPS signals in a memory;

processing said sampled GPS signals by performing fast convolution operations on said sampled GPS signals in said GPS receiver, wherein said processing processes said sampled GPS signals by performing a plurality of fast convolutions on a corresponding plurality of blocks of said sampled GPS signals to provide a plurality of corresponding results of each fast convolution and summing a plurality of mathematical representations of said plurality of corresponding results to obtain a first position information.

13. A method as in claim 12 further comprising:

receiving a data signal containing satellite data information.

14. A method as in claim 13 wherein said satellite data information comprises a Doppler information of a satellite in view of said GPS receiver.

15. A method as in claim 14 wherein said Doppler information is used to compensate said sampled GPS signal and wherein said processing further comprises preprocessing operations.

16. A method as in claim 15 wherein said first position information comprises a pseudorange information.

17. A method as in claim 13 wherein said satellite data information comprises data representative of ephemeris for a satellite.

18. A method as in claim 17 wherein said first position information comprises a pseudorange information and wherein said ephemeris and said pseudorange information are used to calculate a latitude and longitude of said GPS receiver.

19. A method as in claim 18 wherein said latitude and longitude is displayed to a user of said GPS receiver.

20. A method as in claim 18 wherein said latitude and longitude are transmitted by said GPS receiver.

21. A method as in claim 12 wherein said GPS signals originate from pseudolites.

22. A method as in claim 12 wherein said GPS signals originate from orbiting satellites.

23. A GPS receiver as in claim 1 wherein said GPS signals originate from pseudolites.

24. A GPS receiver as in claim 1 wherein said GPS signals originate from orbiting satellites.

25. A method of determining pseudoranges in a global positioning satellite (GPS) receiver, comprising:

receiving GPS signals from one or more in view GPS satellites utilizing an antenna coupled to a downconverter, said GPS signals comprising pseudorandom sequences;

buffering the received GPS signals in a digital snapshot memory;

processing the buffered GPS signals for one or more of the in view GPS satellites in a digital signal processor by:

breaking the buffered data into a series of contiguous blocks whose durations are equal to a multiple of the frame period of the pseudorandom (PN) codes contained within the GPS signals, for each block, creating a compressed block of data with length equal to the duration of a pseudorandom code period by adding together successive subblocks of data, said subblocks having duration equal to one PN frame, such that the corresponding sample numbers of each of the subblocks are added to one another;

for each compressed block, performing a convolution of the compressed block's data against the pseudorandom sequence (PRS) of the GPS satellite being processed, said convolution being performed using fast convolution algorithms, said convolution producing a result;

performing a magnitude-squared operation on the results created from each of said convolutions to produce magnitude-squared data;

combining said magnitude-squared data for all blocks into a single block of data by adding together such blocks of magnitude-squared data, such that the corresponding sample numbers of each of the magnitude-squares from the convolution are added to one another; and finding the location of the peak of said single block of data to high precision using digital interpolation methods, where the location is the distance from the beginning of the data block to the said peak, and the location represents a pseudorange to a GPS satellite corresponding to the PRS being processed.

26. The method of claim 25 wherein the fast convolution algorithm used in processing the buffered GPS signals is a Fast Fourier Transform (FFT) and the result of the convolution is produced by computing the product of the forward transform of said compressed block and a prestored representation of the forward transform of the PRS to produce a first result and then performing an inverse transformation of said first result to recover said result.

27. The method of claim 25 wherein the fast convolution algorithm used in processing the buffered GPS signals is a Winograd algorithm.

28. The method of claim 26 wherein the effects of Doppler induced time delays and local oscillator induced time errors are compensated for on each compressed block of data by inserting between the forward and inverse Fast Fourier Transform operations, the multiplication of the forward FFT of said compressed blocks by a complex exponential whose phase versus sample number is adjusted to correspond to the delay compensation required for said block.

29. The method of claim 25 wherein the digital signal processor is a general purpose programmable digital signal processing chip which is executing stored instructions.

30. The method of claim 25 wherein the fast convolution algorithm used in processing the buffered GPS signals is a Agarwal-Cooley algorithm.

31. The method of claim 25 wherein the fast convolution algorithm used in processing the buffered GPS signals is a split nesting algorithm.

32. The method of claim 25 wherein the fast convolution algorithm used in processing the buffered GPS signals is a recursive polynomial nesting algorithm.

33. The method of claim 25 further including the step of:
determining that said peak is valid by determining whether said peak exceeds a predetermined threshold.

34. A tracking process utilizing global positioning system (GPS) satellites for determining the position of a remote sensor, the process comprising the steps of:
receiving and storing GPS signals at said remote sensor from a plurality of in view GPS satellites;
computing pseudoranges in the sensor utilizing said GPS signals, said computing comprising digital signal processing representations of said GPS signals by performing a plurality of fast convolutions on a corresponding plurality of blocks of data representing said GPS signals to provide a plurality of corresponding results of each fast convolution and summing a plurality of mathematical representations of said plurality of corresponding results to obtain a first position information;
transmitting said pseudoranges from said sensor to a base station, said base station being provided with GPS satellite ephemeris data; and
receiving said pseudoranges at said base station and utilizing said pseudoranges and said satellite ephemeris data to compute a geographic location for said sensor.

35. A tracking process utilizing global positioning system (GPS) satellites for determining the position of a remote sensor, the process comprising the steps of:
receiving and storing GPS signals at said remote sensor from a plurality of in view GPS satellites;
computing pseudoranges in the sensor, utilizing said GPS signals, said computing comprising digital signal processing using fast convolution techniques on stored GPS signals;
transmitting said pseudoranges from said sensor to a base station, said base station being provided with GPS satellite ephemeris data; and
receiving said pseudoranges at said base station and utilizing said pseudoranges and said satellite ephemeris data to compute a geographic location for said sensor, wherein the step of computing the pseudoranges comprises:
storing the received GPS signals in a memory;
processing the stored GPS signals for one or more of the in view GPS satellites in a digital signal processor by:
breaking the stored data into a series of contiguous blocks whose durations are equal to a multiple of the frame period of the pseudorandom (PN) codes contained within the GPS signals;
for each block, creating a compressed block of data with length equal to the duration of a pseudorandom code period by coherently adding together successive subblocks of data, said subblocks having duration equal to one PN frame;
for each compressed block, performing a matched filtering operation to determine the relative timing between the received PN code contained within the block of data and a locally generated PN reference signal, said matched filtering operation utilizing said fast convolution techniques; and
determining said pseudorange by performing a magnitude-squared operation on the products created from said matched filtering operation and combining said magnitude-squared data for all blocks into a single block of data by adding together said blocks of magnitude-squared data to produce a peak, the location of said peak being determined using digital interpolation methods and corresponding to said pseudorange.

36. The tracking process of claim 35 wherein said matched filtering operation comprises:
performing a convolution of the compressed block's data against the pseudorandom sequence (PRS) of the GPS satellite being processed, said convolution being performed using said fast convolution algorithms to produce a product of the convolution.

37. The tracking process of claim 36 wherein the fast convolution algorithm used in processing the buffered GPS signals is a Fast Fourier Transform (FFT) and the product of the convolution is produced by computing the forward transform of said compressed block by a prestored representation of the forward transform of the PRS to produce a first result and then performing an inverse transformation of said first result to recover said product.

38. A method as in claim 12 wherein said GPS signals were sampled at a rate of a multiple of 1.024 MHz to provide said sampled GPS signals.

39. A GPS receiver as in claim 1 wherein said predetermined rate is a multiple of 1.024 MHz.

40. A GPS receiver as in claim 1 wherein said DSP also performs a preprocessing operation.

41. A GPS receiver as in claim 40 wherein said preprocessing operation occurs before said fast convolutions.

42. A GPS receiver as in claim 41 wherein said preprocessing operation comprises correcting for Doppler shift of signals from said view satellite.

43. A GPS receiver as in claim 41 wherein said preprocessing operation comprises adding together portions of said sampled IF GPS signals to provide at least one of said corresponding plurality of blocks of said sampled IF GPS signals.

44. A GPS receiver as in claim 43 wherein said plurality of mathematical representations comprises a plurality of squares of magnitudes.

45. A process utilizing global positioning system (GPS) satellites for determining the position of a remote sensor, the process comprising the steps of:

receiving and storing GPS signals at said remote sensor from a plurality of in view GPS satellites;

computing pseudoranges in the sensor utilizing said GPS signals, said computing comprising digital signal processing representations of said GPS signals by performing a plurality of fast convolutions on a corresponding plurality of blocks of data representing said GPS signals to provide a plurality of corresponding results of each fast convolution and summing a plurality of mathematical representations of said plurality of corresponding results to obtain a first position information;

receiving a transmission of satellite data information comprising data representative of ephemeris for a plurality of satellites;

computing position information in the sensor by using said satellite data information and said pseudoranges.

46. A process as in claim 45 wherein said transmission comes from a basestation.

47. A process as in claim 45 wherein said transmission comprises transmissions from said plurality of satellites.

48. A process as in claim 45 wherein said position information is transmitted to a basestation.

49. A process as in claim 51 further comprising receiving a precision carrier frequency signal from said basestation; automatically locking to said precision carrier frequency signal from said basestation; and calibrating a local oscillator in said remote sensor with said precision carrier frequently signal.

50. A process as in claim 47 wherein said remote sensor comprises a GPS receiver which receives said transmissions comprising data representative of ephemeris for a plurality of satellites.

51. A process utilizing global positioning system (GPS) satellites for determining the position of a remote sensor, the process comprising the steps of:

receiving and storing GPS signals at said remote sensor from a plurality of in view GPS satellites;

computing pseudoranges in the sensor, utilizing said GPS signals, said computing comprising digital signal processing using fast convolution techniques on stored GPS signals;

receiving a transmission of satellite data information comprising data representative of ephemeris for a plurality of satellites;

computing position information in the sensor by using said satellite data information and said pseudoranges, wherein the step of computing the pseudoranges comprises:

storing the received GPS signals in a memory;

processing the stored GPS signals for one or more of the in view GPS satellites in a digital signal processor by:

breaking the stored data into a series of contiguous blocks whose durations are equal to a multiple of the frame period of the pseudorandom (PN) codes contained within the GPS signals;

for each block, creating a compressed block of data with length equal to the duration of a pseudorandom code period by coherently adding together successive subblocks of data, said subblocks having duration equal to one PN frame;

for each compressed block, performing a matched filtering operation to determine the relative timing between the received PN code contained within the block of data and a locally generated PN reference signal, said matched filtering operation utilizing said fast convolution techniques; and determining said pseudorange by performing a magnitude-squared operation on the products created from said matched filtering operation and combining said magnitude-squared data for all blocks into a single block of data by adding together said blocks of magnitude-squared data to produce a peak, the location of said peak being determined using digital interpolation me and corresponding to said pseudorange.

52. The process of claim 51 wherein said matched filtering operation comprises:

performing a convolution of the compressed block's data against the pseudorandom sequence (PRS) of the GPS satellite being processed, said convolution being performed using said fast convolution algorithms to produce a product of the convolution.

53. The process of claim 52 wherein the fast convolution algorithm used in processing the buffered GPS signals is a Fast Fourier Transform (FFT) and the product of the convolution is produced by computing the forward transform of said compressed block by a prestored representation of the forward transform of the PRS to produce a first result and then performing an inverse transformation of said first result to recover said product.

54. A process as in claim 47 wherein said step of computing pseudoranges further comprises performing a preprocessing operation before said fast convolutions.

55. A process utilizing global positioning system (GPS) satellites for determining the position of a remote sensor, the process comprising the steps of:

receiving and storing GPS signals at said remote sensor from a plurality of in view GPS satellites;

computing pseudoranges in the sensor, utilizing said GPS signals, said computing comprising digital signal processing using fast convolution techniques on stored GPS signals, wherein said step of computing comprises:

performing a preprocessing operation before said fast convolution techniques and performing a post processing operation after said fast convolution techniques, wherein said fast convolution techniques comprise a matched filtering operation and wherein said GPS signals are stored in a series of contiguous blocks in a memory and wherein said preprocessing comprises, for each block, creating a compressed block of data by adding together successive subblocks of data, and wherein said post processing comprises adding together a representation of the products created from said matched filtering operation;

receiving a transmission of satellite data information comprising data representative of ephemeris for a plurality of satellites; and computing position information in the sensor by using said satellite data information and said pseudoranges.

56. A process as in claim 34 further comprising receiving a precision carrier frequency signal from said basestation; automatically locking to said precision carrier frequency signal from said basestation; and calibrating a local oscillator in said remote sensor with said precision carrier frequency signal.

57. A process as in claim 34 wherein said step of computing pseudoranges further comprises performing a preprocessing operation before said fast convolutions.

58. A tracking process utilizing global positioning system (GPS) satellites for determining the position of a remote sensor, the process comprising the steps of:

receiving and storing GPS signals at said remote sensor from a plurality of in view GPS satellites;

computing pseudoranges in the sensor, utilizing said GPS signals, said computing comprising digital signal processing using fast convolution techniques on stored GPS signals, wherein said step of computing comprises:

performing a preprocessing operation before said fast convolution techniques and performing a post processing operation after said fast convolution techniques, wherein said fast convolution techniques comprise a matched filtering operation and wherein said GPS signals are stored in a series of contiguous blocks in a memory and wherein said preprocessing comprises, for each block, creating a compressed block of data by adding together successive sub-blocks of data, and wherein said post processing comprises adding together a representation of the products created from said matched filtering operation;

transmitting said pseudoranges from said sensor to a base station, said base station being provided with GPS satellite ephemeris data; and receiving said pseudoranges at said base station and utilizing said pseudoranges and said satellite ephemeris data to compute a geographic location for said sensor.

59. A GPS receiver as in claim 7 wherein said satellite data information comprises an identification of a plurality of satellites in view of said GPS receiver and a corresponding plurality of Doppler information for each satellite of said plurality of satellites in view of said GPS receiver.

60. A GPS receiver as in claim 7 further comprising a power management circuit coupled to said downconverter and to said digitizer, wherein after said IF GPS signals are stored in said memory, said power management circuit reduces power consumed by said downconveter and said digitizer.

* * * * *

UNITED STATES PATENT AND TRADEMARK OFFICE
CERTIFICATE OF CORRECTION

| | | |
|---|---|---|
| PATENT NO. | : | 5,663,734 |
| DATED | : | September 2, 1997 |
| INVENTOR(S) | : | Norman F. Krasner |

It is certified that error appears in the above-identified patent and that said Letters Patent is hereby corrected as shown below:

In column 3 at line 60 delete "element" and insert --elements--

In column 10 at line 34 delete "ND" and insert --A/D--.

In column 17 at line 2 delete "5" and insert --505--

In column 47 at line 50 delete "frequently" and insert --frequency--

Signed and Sealed this

Sixteenth Day of December, 1997

Attest:

Attesting Officer

BRUCE LEHMAN

Commissioner of Patents and Trademarks